(12) United States Patent
Khoshkava et al.

(10) Patent No.: US 10,409,376 B2
(45) Date of Patent: Sep. 10, 2019

(54) HAPTIC ACTUATOR HAVING A SMART MATERIAL ACTUATION COMPONENT AND AN ELECTROMAGNET ACTUATION COMPONENT

(71) Applicant: Immersion Corporation, San Jose, CA (US)

(72) Inventors: Vahid Khoshkava, Montreal (CA); Juan Manuel Cruz-Hernandez, Montreal (CA)

(73) Assignee: IMMERSION CORPORATION, San Jose, CA (US)

( * ) Notice: Subject to any disclaimer, the term of this patent is extended or adjusted under 35 U.S.C. 154(b) by 148 days.

(21) Appl. No.: 15/724,751

(22) Filed: Oct. 4, 2017

(65) Prior Publication Data
US 2019/0101986 A1 Apr. 4, 2019

(51) Int. Cl.
*G06F 3/01* (2006.01)
*B06B 1/06* (2006.01)
(Continued)

(52) U.S. Cl.
CPC ............ *G06F 3/016* (2013.01); *B06B 1/0207* (2013.01); *B06B 1/045* (2013.01); *B06B 1/0603* (2013.01);
(Continued)

(58) Field of Classification Search
None
See application file for complete search history.

(56) References Cited

U.S. PATENT DOCUMENTS

2007/0236449 A1* 10/2007 Lacroix ............ H04M 1/72522
345/156
2014/0218324 A1 8/2014 Tissot
(Continued)

FOREIGN PATENT DOCUMENTS

KR 10-2010-0045543 A 5/2010
KR 10-1016208 B1 2/2011

OTHER PUBLICATIONS

The Partial European Search Report (R. 64 EPC) issued in European Application No. 18197481.7, dated Feb. 27, 2019.

*Primary Examiner* — Joseph R Haley
(74) *Attorney, Agent, or Firm* — Medler Ferro Woodhouse & Mills PLLC

(57) ABSTRACT

A haptic actuator comprising a first actuation component and a second actuation component is presented. The first actuation component comprises a first layer of actuatable material and electrodes on opposite sides of the first layer, wherein the actuatable material is configured to deform upon any electrical signal being applied to at least one of the electrodes. The haptic actuator further comprises a second layer separated from the first actuation component by one or more spacers. The second actuation component comprises a magnetized material and one or more electromagnets. Either the magnetized material or the one or more electromagnets are disposed on the first actuation component, and relative movement between the magnetized material and the one or more electromagnets is generated upon any electrical signal being applied to the one or more electromagnets, wherein the relative movement causes vibration of the first actuation component.

22 Claims, 16 Drawing Sheets

(51) Int. Cl.
*B06B 1/04* (2006.01)
*H01L 41/187* (2006.01)
*B06B 1/02* (2006.01)
*H01L 41/193* (2006.01)
*H04M 1/725* (2006.01)
*H04M 1/02* (2006.01)

(52) U.S. Cl.
CPC .......... *H01L 41/187* (2013.01); *H01L 41/193* (2013.01); *H04M 1/026* (2013.01); *H04M 1/72522* (2013.01)

(56) References Cited

U.S. PATENT DOCUMENTS

2017/0090576 A1\* 3/2017 Peterson .................. G06F 3/016
2019/0064997 A1\* 2/2019 Wang .................... G06F 3/0418

\* cited by examiner

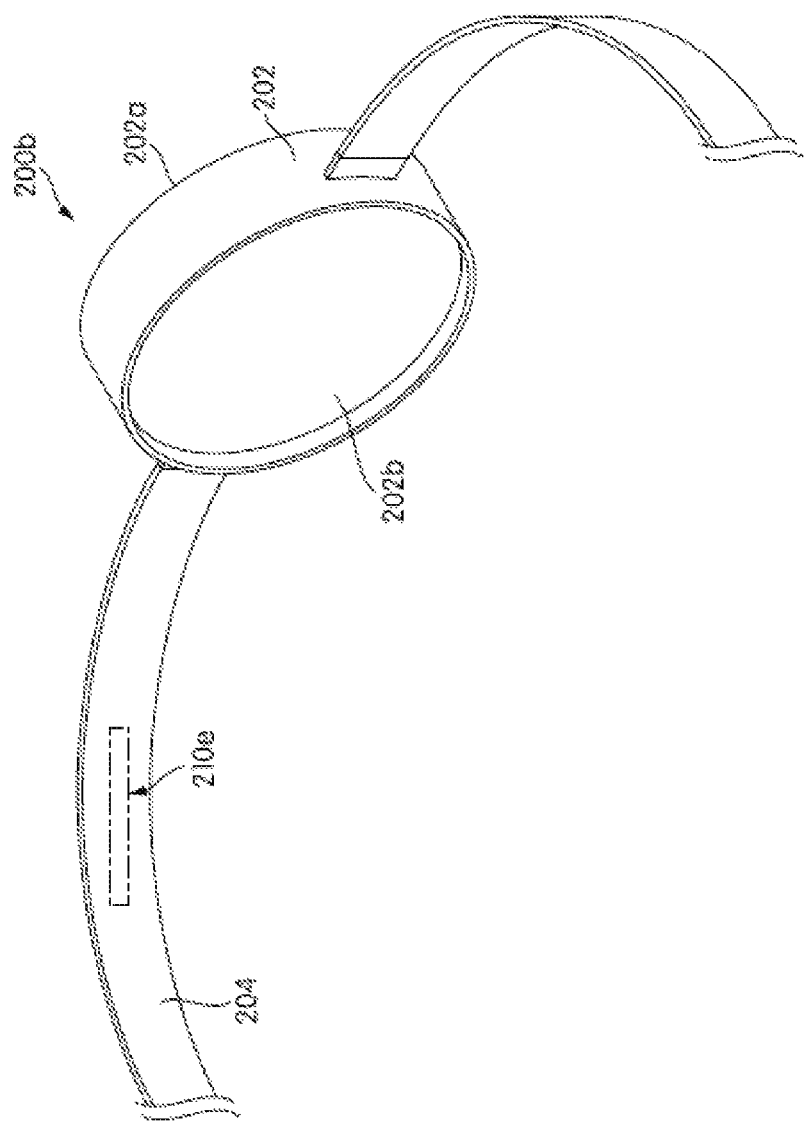

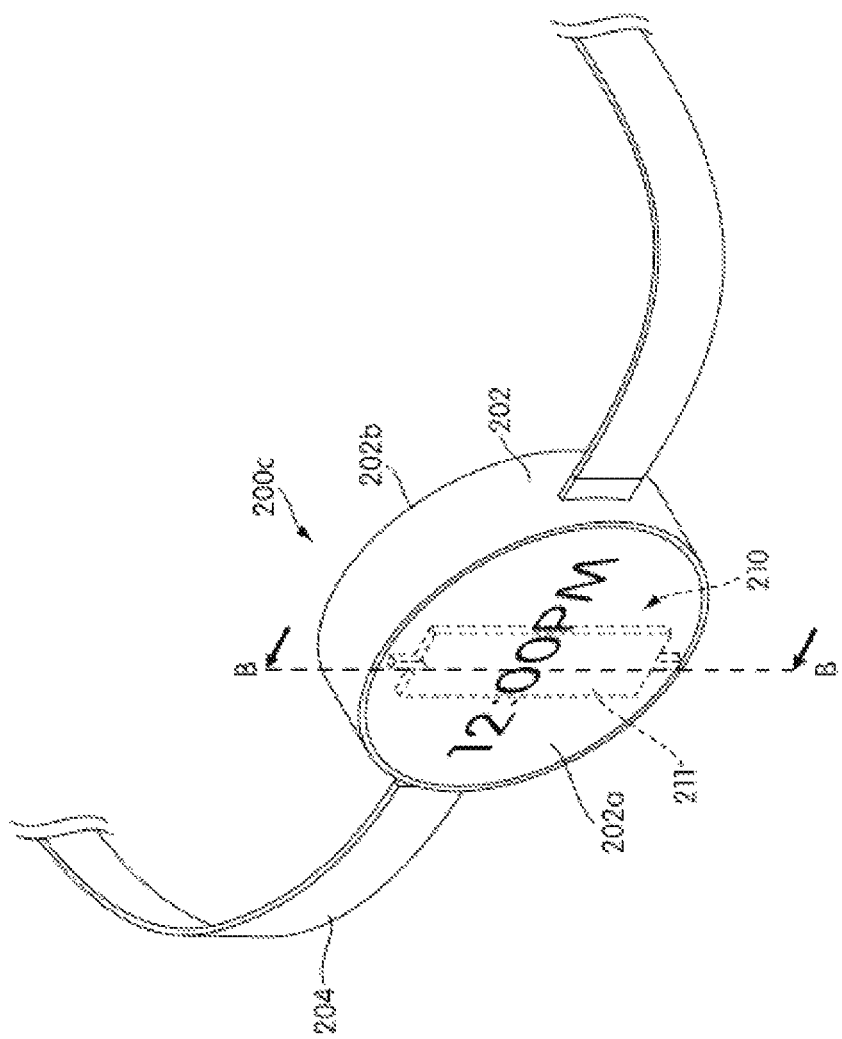

ness or the following detailed description.
HAPTIC ACTUATOR HAVING A SMART MATERIAL ACTUATION COMPONENT AND AN ELECTROMAGNET ACTUATION COMPONENT

FIELD OF THE INVENTION

The present invention is directed to an electret-based electrostatic haptic actuator, and has application in user interfaces, gaming, automotive, wearable devices, and consumer electronics.

BACKGROUND

Electronic device manufacturers strive to produce a rich interface for users. Many devices use visual and auditory cues to provide feedback to a user. In some interface devices, a vibrotactile haptic effect is also provided to the user. Haptic effects can provide cues that enhance and simplify the user interface. For example, they may provide cues to users of electronic devices to alert the user to specific events, or provide realistic feedback to create greater sensory immersion within a simulated or virtual environment.

To generate a haptic effect, many devices use an actuator. Example actuators for generating a haptic effect (also referred to as a haptic actuator) include an electromagnet actuator such as an eccentric rotating mass (ERM) actuator, a linear resonant actuator (LRA), or an electroactive polymer (EAP) actuator.

SUMMARY

The following detailed description is merely exemplary in nature and is not intended to limit the invention or the application and uses of the invention. Furthermore, there is no intention to be bound by any expressed or implied theory presented in the preceding technical field, background, brief summary or the following detailed description.

One aspect of the embodiments herein relate to a haptic actuator comprising a first actuation component and a second actuation component. The first actuation component comprises a first layer of actuatable material and comprises electrodes on opposite sides of the first layer, wherein the actuatable material is configured to deform upon any electrical signal being applied to at least one of the electrodes. The haptic actuator further comprises a second layer separated from the first actuation component by one or more spacers. The second actuation component comprises a magnetized material and one or more electromagnets. Either the magnetized material or the one or more electromagnets are disposed on the first actuation component, and relative movement between the magnetized material and the one or more electromagnets is generated upon any electrical signal being applied to the one or more electromagnets, wherein the relative movement between the magnetized material and the one or more electromagnets causes vibration of the first actuation component.

In an embodiment, the magnetized material of the second actuation component is disposed on either one of: a first surface of the first actuation component or a second surface of the second layer, and the one or more electromagnets are disposed on the other one of the first surface of the first actuation component or the second surface of the second layer.

In an embodiment, the first surface of the first actuation component faces the second surface of the second layer, and wherein the magnetized material is disposed on the first surface of the first actuation component, and the one or more electromagnets are disposed on the second surface of the second layer.

In an embodiment, the haptic actuator further comprises a haptic control unit configured to apply a first electrical signal to one of the electrodes on opposite sides of the first layer of actuatable material of the first actuation component, and configured to apply a second electrical signal to the one or more electromagnets of the second actuation component, wherein the second electrical signal is a periodic signal having a second frequency, and the first electrical signal is a periodic signal having a first frequency lower than the second frequency, or is a direct current (DC) signal.

In an embodiment, wherein the first frequency is in a range of 1 Hz to 500 Hz, and the second frequency is in a range of 1 Hz to 500 Hz.

In an embodiment, the first electrical signal has a first amplitude, and the second electrical signal has a second amplitude that is lower than the first amplitude.

In an embodiment, the first amplitude is in a range of 1 V to 2000 V, and the second amplitude is in a range of 1 V to 12 V.

In an embodiment, the one or more electromagnets of the second actuation component comprises one or more respective conductive coils, and wherein the magnetized material of the second actuation component comprises a polymer film having magnetized particles embedded therein.

In an embodiment, the first layer of actuatable material of the first actuation component is a layer of electroactive polymer (EAP) material.

In an embodiment, the first layer of actuatable material of the first actuation component includes at least one of an elastomer material, a shape memory alloy, or a ceramic composite material.

In an embodiment, the haptic actuator further comprises a first signal generator electrically connected to at least one of the electrodes disposed on opposite sides of the first layer of actuatable material, and a second signal generator electrically connected to the one or more electromagnets of the second actuation component.

In an embodiment, the haptic actuator has a thickness that is in a range of 0.001 mm to 10 mm.

In an embodiment, the one or more spacers have a thickness that is in a range of 0.1 mm to 10 mm, and are configured to form a suspension between the first actuation component and the second layer, wherein the suspension has a resonance frequency that is in a range of 1 Hz and 500 Hz.

In an embodiment, the haptic actuator further comprises a third layer disposed between the first layer and the second layer and attached to the one or more spacers via an elastic material, wherein the one or more electromagnets of the second actuation component include a first electromagnet or first set of electromagnets disposed on a surface of the first actuation component, and a second electromagnet or second set of electromagnets disposed on a surface of the second layer, and wherein the magnetized material of the second actuation component is disposed on the third layer.

In an embodiment, wherein the haptic actuator further comprises a haptic control unit configured to determine, based on a desired direction of actuation, whether to actuate only the first electromagnet or first set of electromagnets, actuate only the second electromagnet or second set of electromagnets, or actuate both the first electromagnet or first set of electromagnets and the second electromagnet or second set of electromagnets.

In an embodiment, the haptic control unit is configured: in response to a determination to actuate the third layer in a direction perpendicular to the surface of the first actuation component, to activate only the first electromagnet or first set of electromagnets or activate only the second electromagnet or second set of electromagnets. The haptic control unit is further configured, in response to a determination to actuate the third layer in the direction parallel to the surface of the first actuation component, to activate both the first electromagnet or first set of electromagnets and the second electromagnet or second set of electromagnets.

In an embodiment, the haptic actuator further comprises a third layer disposed between the first layer and the second layer and attached to the one or more spacers via an elastic material, wherein the one or more electromagnets of the second actuation component are disposed on the third layer, and wherein the magnetized material is disposed on a first surface of the first layer and on a second surface of the second layer.

One aspect of the embodiments herein relates to a haptic-enabled user interface device comprising: a housing having a first outer surface and a second and opposite outer surface. The haptic-enabled user interface device further comprises a haptic actuator disposed within or outside the housing, and adjacent to the first outer surface or the second outer surface, the haptic actuator further comprising: a first actuation component and a second actuation component. The first actuation component has a first layer of an actuatable material and comprises electrodes on opposite sides of the first layer, wherein the actuatable material is configured to deform upon any electrical signal being applied to at least one of the electrodes. The haptic actuator further comprises a second layer separated from the first actuation component by one or more spacers, and disposed closer than the first layer to an interior of the housing. The second actuation component comprises a magnetized material and one or more electromagnets, wherein either the magnetized material or the one or more electromagnets are disposed on the first actuation component, wherein relative movement between the magnetized material and the one or more electromagnets is generated upon any electrical signal being applied to the one or more electromagnets, and wherein the haptic actuator is configured to generate a haptic effect at the first outer surface or the second outer surface of the housing of the haptic-enabled device by activating at least one of the first actuation component or the second actuation component.

In an embodiment, the haptic-enabled device further comprises a flexible display device having an outer surface, wherein the outer surface of the flexible display device forms at least part of the first outer surface of the haptic-enabled device.

In an embodiment, the haptic-enabled device is a wearable electronic device, the one or more spacers of the haptic actuator is a first spacer or first set of spacers, the haptic actuator is adjacent to the second outer surface of the housing, and is configured to deform the second outer surface when the first actuation component of the haptic actuator is activated. Additionally, the housing of the haptic-enabled device includes a second spacer or second set of spacers that extend outwardly past the haptic actuator and the second outer surface of the housing, so as to provide clearance between second outer surface and any object in contact with the second spacer or second set of spacers.

In an embodiment, the second spacer or second set of spacers form a rim that extends outwardly past the second outer surface of the housing.

In an embodiment, the haptic actuator is disposed within the housing, the second outer surface being formed from a layer of flexible material, and wherein deformation of the first actuation component of the haptic actuator causes deformation of the layer of flexible material of the second outer surface of the housing.

In an embodiment, the haptic actuator is disposed outside of the housing, and the second layer of the haptic actuator is adhered to the second outer surface of the housing.

In an embodiment, the haptic-enabled device is an electronic watch.

In an embodiment, the haptic actuator is adjacent to the first outer surface of the housing, and is configured to deform the first outer surface of the housing when the first actuation component of the haptic actuator is activated.

In an embodiment, the haptic-enabled device is a mobile phone, and wherein the haptic-enabled device further comprises a haptic control unit configured: to determine that the haptic-enabled device is receiving or has received communication from another mobile phone, and to determine whether a priority level of communication exceeds a defined threshold. The haptic control unit is configured, in response to a determination that the priority level of the communication exceeds the defined threshold, to provide a first electrical signal to at least the one or more electromagnets, the first electrical signal having a frequency that is in a range of 1 Hz to 500 Hz. The haptic control unit is further configured, in response to a determination that the priority level of the communication does not exceed the defined threshold, to provide a second electrical signal to at least one of the electrodes on opposite sides of the first layer of actuatable material, the second electrical signal having a frequency that is in a range of 1 Hz to 500 Hz.

In an embodiment, the haptic-enabled device is configured to output a tap or a series of taps with the first layer of actuatable material of the first actuation component of the haptic actuator.

BRIEF DESCRIPTION OF THE DRAWINGS

The foregoing and other features and advantages of the invention will be apparent from the following description of embodiments hereof as illustrated in the accompanying drawings. The accompanying drawings, which are incorporated herein and form a part of the specification, further serve to explain the principles of the invention and to enable a person skilled in the pertinent art to make and use the invention. The drawings are not to scale.

FIGS. 6A and 6B illustrate views of a haptic-enabled device, according to an embodiment hereof.

FIGS. 7A and 7B illustrate views of a haptic-enabled device, according to an embodiment hereof.

DETAILED DESCRIPTION

Figure 1B:
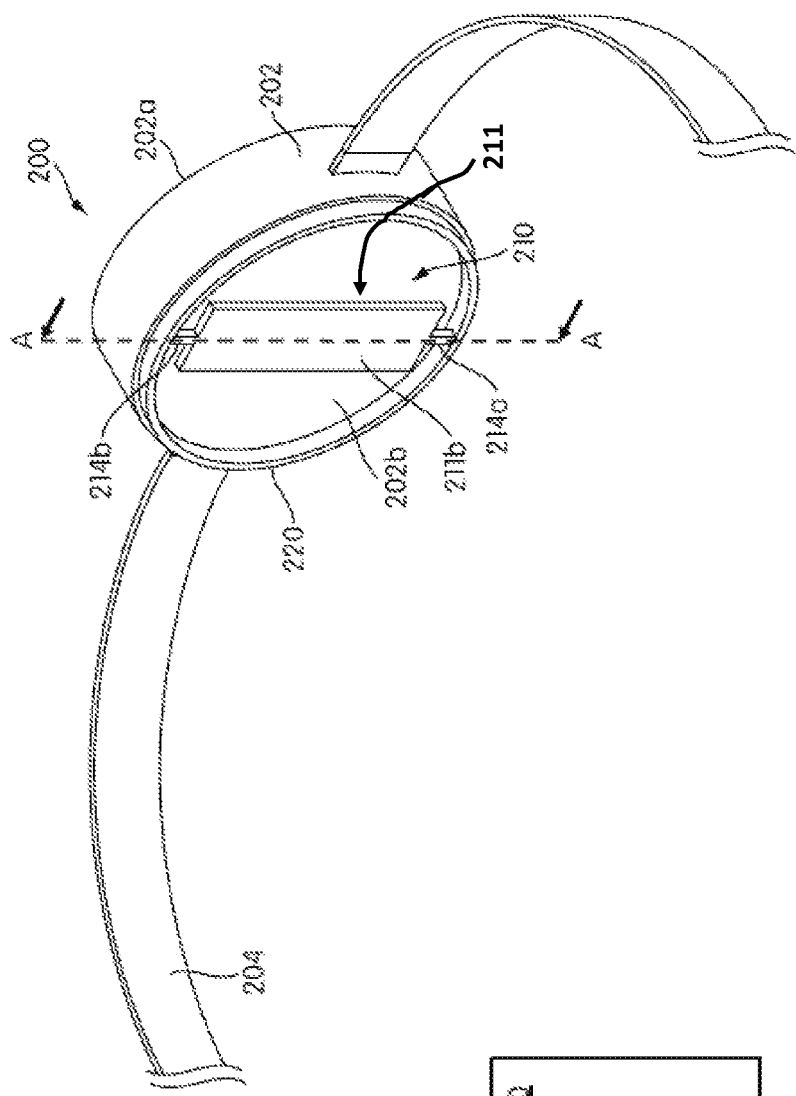
FIG. 1B illustrates a perspective view of a wearable haptic-enabled device, according to an embodiment hereof.

The following detailed description is merely exemplary in nature and is not intended to limit the invention or the application and uses of the invention. Furthermore, there is no intention to be bound by any expressed or implied theory presented in the preceding technical field, background, brief summary or the following detailed description.

Embodiments herein relate to a haptic actuator that includes, as subcomponents thereof, a smart material actuation component and an electromagnet actuation component. The haptic actuator may be, e.g., part of a haptic-enabled device (e.g., an electronic watch or mobile phone), and may be used to generate a haptic effect for the haptic-enabled device. The smart material actuation component may more generally be a first actuation component that has a layer of actuatable material that deforms when an electrical potential is applied thereto. The electrical potential may be applied to the actuatable material by applying an electrical signal to an electrode in contact with the actuatable material. The electromagnet actuation component may more generally be a second actuation component that comprises magnetized material and one or more electromagnets.

In an embodiment, the smart material actuation component may be used to provide a haptic effect with content that includes a relatively high force or displacement (e.g., as a deformation for haptic effect). This relatively high force or displacement content may be static, or may have a relatively low frequency. In an embodiment, the electromagnet actuation component may be used to provide a haptic effect with content that includes a relatively high frequency content. This relatively high frequency content may have a relatively low force (e.g., it may be a vibrotactile part of a haptic effect). For instance, within the haptic actuator, the smart material actuation component and the electromagnet actuation component may be activated separately or simultaneously to generate various haptic effects that have different respective frequency content, force content, and/or displacement content. In one example, the smart material actuation component of the haptic actuator may be activated to deform and generate a series of taps at a relatively low frequency, and the electromagnet actuation component of the haptic actuator may be activated to generate a vibration (also referred to as a vibrotactile effect) at a relatively high frequency. The electromagnet actuation component may generate the vibration by also causing deformation in a component of the haptic actuator, but on a much smaller scale than deformation caused by the smart material actuation component. The smart material actuation component and the electromagnet actuation component of the haptic actuator may be activated at different times, or activate them simultaneously. For instance, the smart material actuation component may tap on a user's hand or wrist, while the electromagnet actuation component simultaneously vibrates.

In an embodiment, the haptic actuator may be incorporated into a user interface component of a haptic-enabled device, such as a touch pad of a laptop, or a touch screen of a mobile phone. In an embodiment, the haptic actuator may be formed as a thin actuator and incorporated into a wearable haptic-enabled electronic device, such as a haptic-enabled electronic watch (e.g., a smart watch). In some instances, the haptic actuator may be disposed on or within a watch band of the electronic watch, so as to provide a haptic effect that can be felt on a user's wrist. In some instances, the haptic actuator may be disposed adjacent to a rear outer surface of a housing of the electronic watch, so as to provide a haptic effect at the rear outer surface that can be felt on the user's wrist. In some instances, the haptic actuator may be disposed adjacent to a front outer surface of the housing of the electronic watch, so as to provide a haptic effect that can be felt at the front outer surface, such as when a user's finger presses or otherwise touches the front outer surface of the watch housing.

In an embodiment, the haptic actuator may be formed with at least a first layer and a second layer. The first layer (e.g., a top layer) of the haptic actuator may form part of the smart material actuation component. The second layer (e.g., a bottom layer) of the haptic actuator may be used to mount or contain elements of the electromagnet actuation component. The first layer and the second layer may, in an embodiment, be separated by one or more spacers. The haptic actuator may be referred to as a two-layer actuator (see, e.g., discussion of FIG. 2A).

In an embodiment, the haptic actuator may be formed with at least a first layer, a second layer, and a third layer. The first layer may form part of the smart material actuation component, while the second layer and the third layer may be used to mount or contain components of the electromagnet actuation component. The first, second, and third layers may, in an embodiment, all be separated from each other. The actuator may be referred to as a three-layer actuator (see, e.g., discussion of FIG. 9).

Figure 1A:
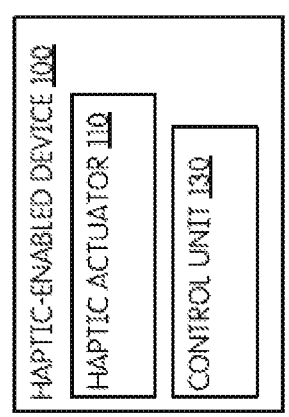
FIG. 1A illustrates a block diagram of a haptic-enabled device, according to an embodiment hereof.

FIG. 1A illustrates a block diagram of a haptic-enabled device 100 that includes a haptic actuator 110 of embodiments described herein. The haptic-enabled device 100 may be, e.g., a wearable electronic device, a mobile phone, a tablet computer, a laptop, a game console controller, or any other user interface device. In an embodiment, the haptic-enabled device 100 may have a housing, and the haptic actuator 110 may be disposed within the housing, or outside of the housing (e.g., on an outer surface of the housing). As discussed in more detail below, the haptic actuator 110 may be used to generate a haptic effect, such as each of a haptic effect having high-frequency content, a haptic effect having low-frequency content, a vibrotactile haptic effect, a static deformation haptic effect, or a combination thereof. The haptic-enabled device 100 may further include a control unit 130 for controlling the haptic actuator 110. The control unit 130 may be a microprocessor or other control circuit that is, e.g., also used to control other operations of the haptic-enabled device 100, or may be dedicated to controlling haptic effects in the haptic-enabled device 100. The control unit 130 may be implemented as a microprocessor, a programmable logic array (PLA), a field programmable gate array (FPGA), or as any other control unit. In an embodiment, the haptic-enabled device 100 may further include a power supply, such as a battery.

FIG. 1B illustrates an embodiment of a haptic-enabled device 200 that is a wearable electronic device, and more specifically an electronic watch. The haptic-enabled device 200 includes a watch housing 202, a watch band 204, and a haptic actuator 210. The watch housing 202 may have a first outer surface that is a front outer surface 202a, and have a second outer surface, opposite to the first outer surface, that is a rear outer surface 202b. In an embodiment, the front outer surface 202a may be a surface of a screen (e.g., touch screen), or a surface on which another user interface component (e.g., a button) is provided, or a combination thereof. In an embodiment, a watch face may be presented on or through the front outer surface 202a. The rear outer surface 202b may be an opposite surface to the front outer surface 202a of the housing 202. When the haptic-enabled device 200 is being worn, the rear outer surface 202b may also be the surface that faces and contacts a wrist on which the haptic-enabled device 200 is worn.

In an embodiment, a haptic actuator 210 may be disposed adjacent to the front outer surface 202a or the rear outer surface 202b of the housing 202. FIG. 1B, for instance, illustrates the haptic actuator 210 being disposed adjacent to the rear outer surface 202b of the housing 202. In the context of FIG. 1B, the haptic actuator 210 may be disposed adjacent to the rear outer surface 202b by being placed outside or exterior of the housing 202, and by being either directly in contact with the rear outer surface 202b (e.g., adhered to the rear outer surface 202b) or suspended slightly over the rear outer surface 202b. In another embodiment, the haptic actuator 210 may be disposed adjacent to the rear outer surface 202b by being disposed within an interior of the housing 202, and sufficiently close to a layer forming the rear outer surface 202b such that deformation in the haptic actuator 210 will cause deformation of the rear outer surface 202b. For instance, the rear outer surface 202b may be formed from a layer of flexible material, and the haptic actuator 210 may be in contact with the layer of flexible material, or may be separated from the layer of flexible material by a small distance. If the haptic actuator 210 is separated from the layer of flexible material by a small distance, the distance may be sufficiently small such that deformation of the haptic actuator 210 causes deformation of the layer of flexible material forming the rear outer surface 202b. By being disposed adjacent to the rear outer surface 202b, the haptic actuator 210 may be configured to provide a haptic effect that can be felt at a user's wrist when the haptic-enabled device 200 is being worn.

As discussed above, FIG. 1B illustrates a haptic actuator 210 disposed adjacent to the rear outer surface 202b. In an embodiment, the haptic actuator 210 may be oriented such that a surface 211b of a first actuation component 211 faces outwardly or exteriorly. As discussed in more detail below, the first actuation component 211 may be an actuation component that uses a layer of smart material, or more generally an actuatable material that is configured to deform upon an electrical potential being applied to the actuatable material (e.g., an electroactive polymer, or EAP). The orientation of the haptic actuator 210 may allow the first actuation component 211 to be actuated to contact a user's wrist when the haptic-enabled device 200 is being worn, so that the first actuation component 211 can impart tactile sensation (e.g., tapping sensation) to the user's wrist.

In an embodiment, the housing 202 may have a spacer 220 that is formed to extend outwardly past the surface 211b of the first actuation component 211 of the haptic actuator 210 and past the rear outer surface 202b of the housing 202. The spacer 220 may provide clearance between the rear outer surface 202b and any object (e.g., a user's wrist) in contact with the spacer 220. This clearance may provide space for the haptic actuator 210 to actuate, and prevent the haptic actuator 210 from being dampened by an object (e.g., a user's wrist) in contact with the haptic-enabled device 200. The dampening may occur, for instance, when the haptic-enabled device 200 is without the spacer 220 and is being worn around a user's wrist, and the haptic actuator 210 is pressed directly against the wrist, which may obstruct movement of various components of the haptic actuator 210. The presence of the spacer 220 may provide a degree of separation between the haptic actuator 210 and the user's wrist, and lower an amount of contact therebetween (relative to if the spacer 220 were not present). The spacer 220 may thus reduce or eliminate dampening that the user's wrist may cause toward the haptic actuator 210. In an embodiment, as illustrated in a sectional view provided in FIGS. 2A-2C, the spacer 220 may cause a gap G to exist between the user's wrist W and the haptic actuator 210 when the first actuation component 211 of the haptic actuator 210 is not being deformed. As discussed above, the first actuation component 211 may deform into this gap G and then come into contact with the user's wrist W to provide a tactile sensation thereon.

Returning to FIG. 1B, in an embodiment the spacer 220 of the haptic-enabled device 200 forms a rim on the rear outer surface 202b of the housing 202. In an embodiment, the rim may form a periphery around the rear outer surface 202b of the housing 202. In an embodiment, as illustrated in FIG. 1B, the spacer 220 may be a single continuous structure. In an embodiment, the haptic-enabled device 200 may have a set of spacers that constitute separate structures, and that extend outwardly past the rear outer surface 202b and the haptic actuator 210. In another embodiment, a spacer of the haptic-enabled device 200 may be any other structure suitable for spacing the rear outer surface 202b of the housing 202 from a wearer to allow unimpeded actuation of the haptic-enabled device 200. While FIG. 1B illustrates the haptic actuator 210 being part of an electronic watch, the haptic actuator 210 may be part of other wearable devices, such as an activity tracker bracelet (e.g., a Fitbit® device), a virtual reality (VR) device such as a head-mounted device (HMD), an augmented reality (AR) device such as a set of glasses, a haptic glove, a haptic gaming vest, or any other wearable device.

Figure 2A:
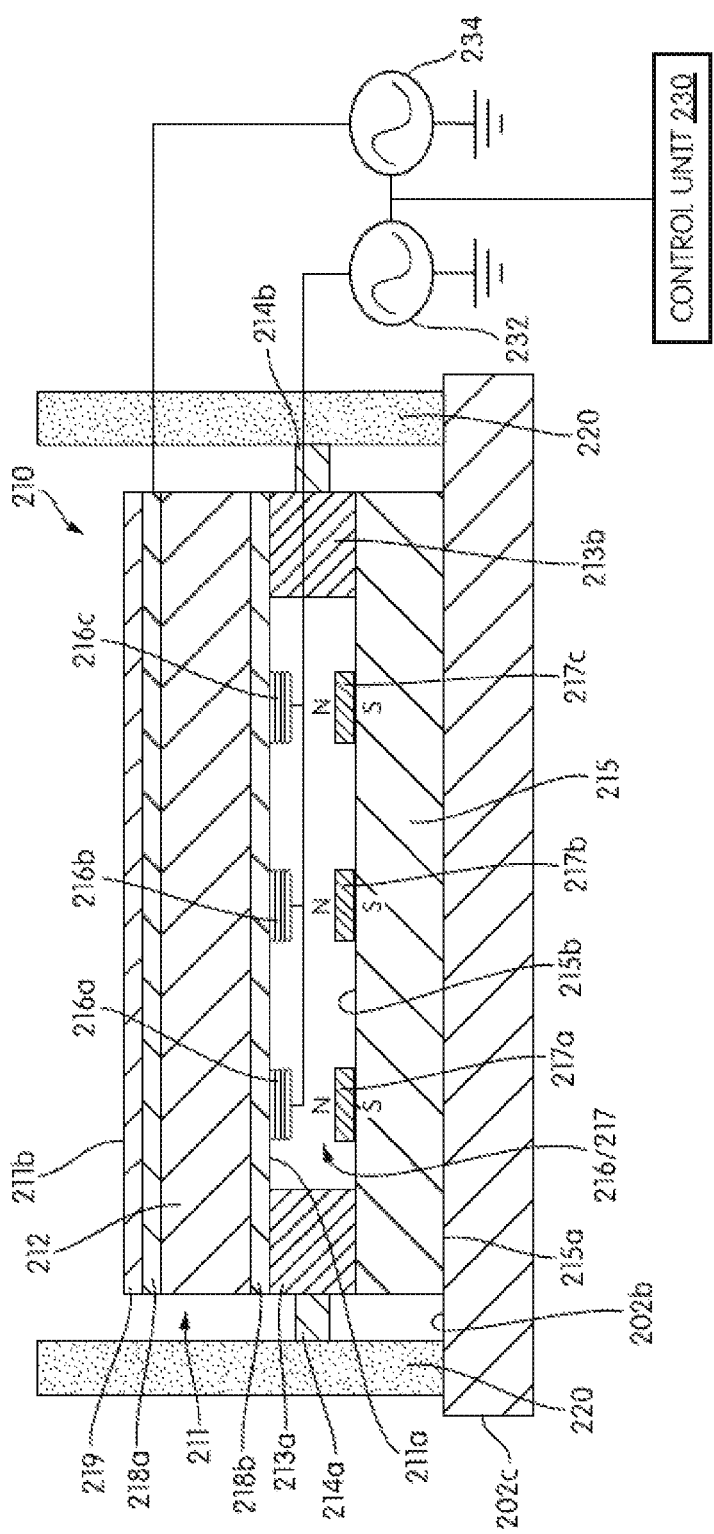
FIGS. 2A and 2B illustrate views of a haptic actuator, according to an embodiment hereof.

FIG. 2A illustrates a sectional view of the haptic actuator 210 viewed along the line A-A in FIG. 1B. As depicted in FIG. 2A, the haptic actuator 210 includes the first actuation component 211 and a second actuation component 216/217. The first actuation component 211 in FIG. 2A may be a smart material actuation component that includes a first layer 212 of actuatable material, and includes two electrodes 218a, 218b disposed on and in contact with opposite sides of the first layer 212. In an embodiment, the first actuation component 211 includes an electrically insulating layer 219 disposed on electrode 218a. In another embodiment, the electrically insulating layer 219 is omitted. The second actuation component 216/217 includes electromagnets 216a, 216b, 216c, and includes magnetized material of permanent magnets 217a, 217b, 217c. The haptic actuator 210 further includes a second layer 215, and a plurality of spacers 213a, 213b separating the first actuation component 211 and the second layer 215. In another embodiment, the haptic actuator 210 may have only a single spacer (e.g., a ring-shaped spacer) separating the first actuation component and the second layer 215. In an embodiment, the spacers 213a, 213b may be made from a sheet of material such as polyimide. In FIG. 2A, the haptic actuator 210 further includes tabs 214a, 214b that connect the haptic actuator 210 to a spacer 220 of the housing 202. In another embodiment, the tabs 214a, 214b and electrically insulating layer 219 may be omitted.

As discussed above, the first actuation component 211 includes a first layer 212 of actuatable material, such as a smart material, that deforms when an electrical potential is applied to the actuatable material, wherein the electrical potential may create a voltage drop across the actuatable material. In an embodiment, the actuatable material may take up all of the first layer 212. Examples of the actuatable material include a smart material such as an electroactive polymer (EAP) (e.g., homopolymer, copolymer, or terpolymer having polyvinylidene fluoride (PVDF)), a piezoelectric material, a dielectric elastomer material, a shape memory alloy (or, more generally, a shape memory material), and/or a ceramic composite material. In an embodiment, the first layer 212 of actuatable material is optimized for static deformation or low-frequency vibration. For instance, the first layer 212 of actuatable material may be configured for static deformation to output a static force by bending to a particular position, and holding that position. The static force may be, e.g., output against a user's finger or hand. The term vibration may refer to deformation that oscillates for one or more cycles. For instance, the oscillating deformation may involve material oscillating between deforming in one direction (e.g, upward) and deforming in a second and opposite direction (e.g., downward), or involve material oscillating between being in a deformed state and being in a non-deformed state. As discussed below, a signal generator may generate an electrical drive signal to cause the vibration. A frequency of the oscillation for the vibration may be equal to or substantially equal to a frequency of the electrical drive signal.

In an embodiment, electrodes 218a and 218b are both in contact with the first layer 212 of actuatable material. In this embodiment, an electrical potential is applied to the first layer 212 of actuatable material by applying an electrical signal to electrode 218a, while electrically connecting electrode 218b to a ground potential (i.e., electrode 218b is a ground electrode). As discussed above, the first actuation component may further include an electrically insulating layer 219 (e.g., a plastic layer) disposed on electrode 218a to prevent direct electrical contact between the electrode 218a and a user. In such an embodiment, the surface 211b (which may be considered an outward-facing surface of the first actuation component 211) may be the same as an outer surface of the electrically insulating layer 219. In another embodiment, the electrically insulating layer 219 may be omitted, and the surface 211b may be the same as an outer surface of electrode 218a.

Figure 5A:
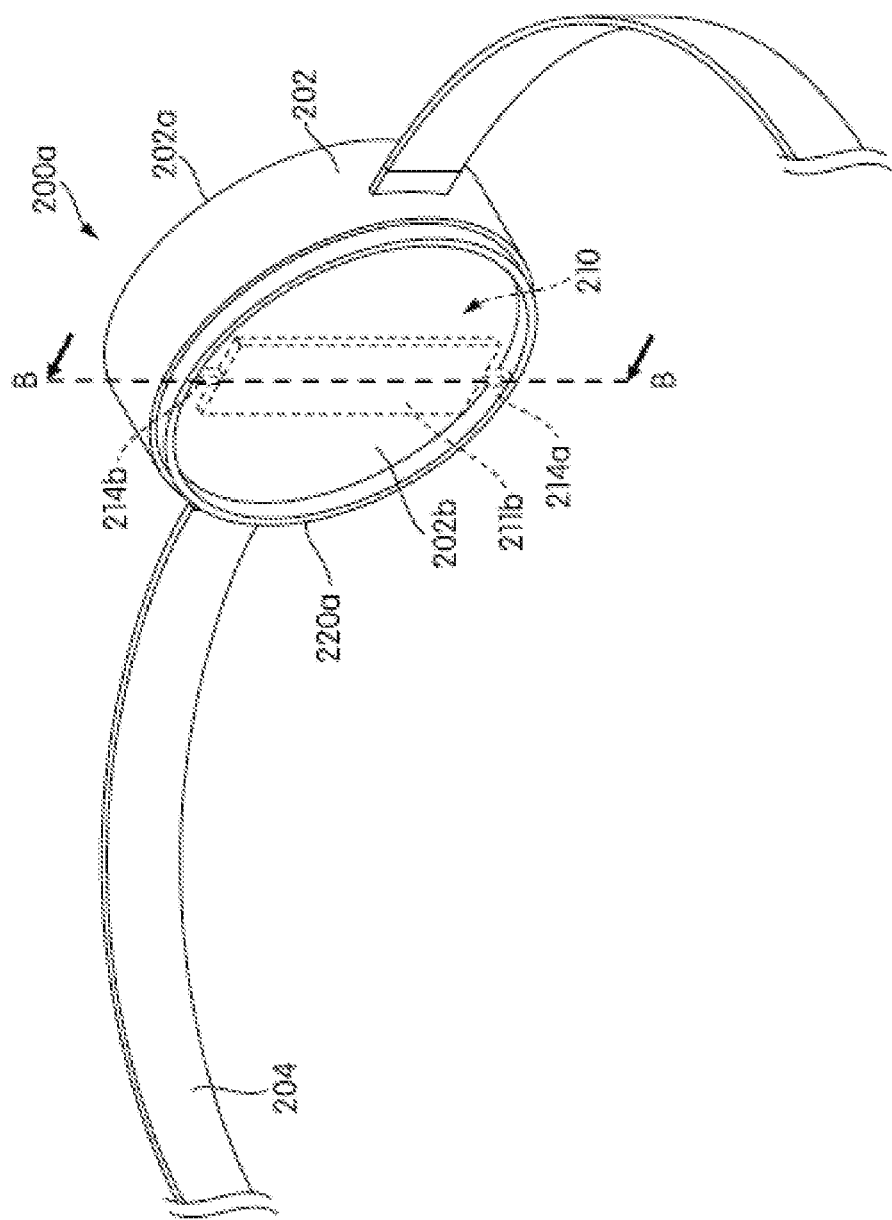
FIGS. 5A and 5B illustrate views of a haptic-enabled device, according to an embodiment hereof.
Figure 5B:
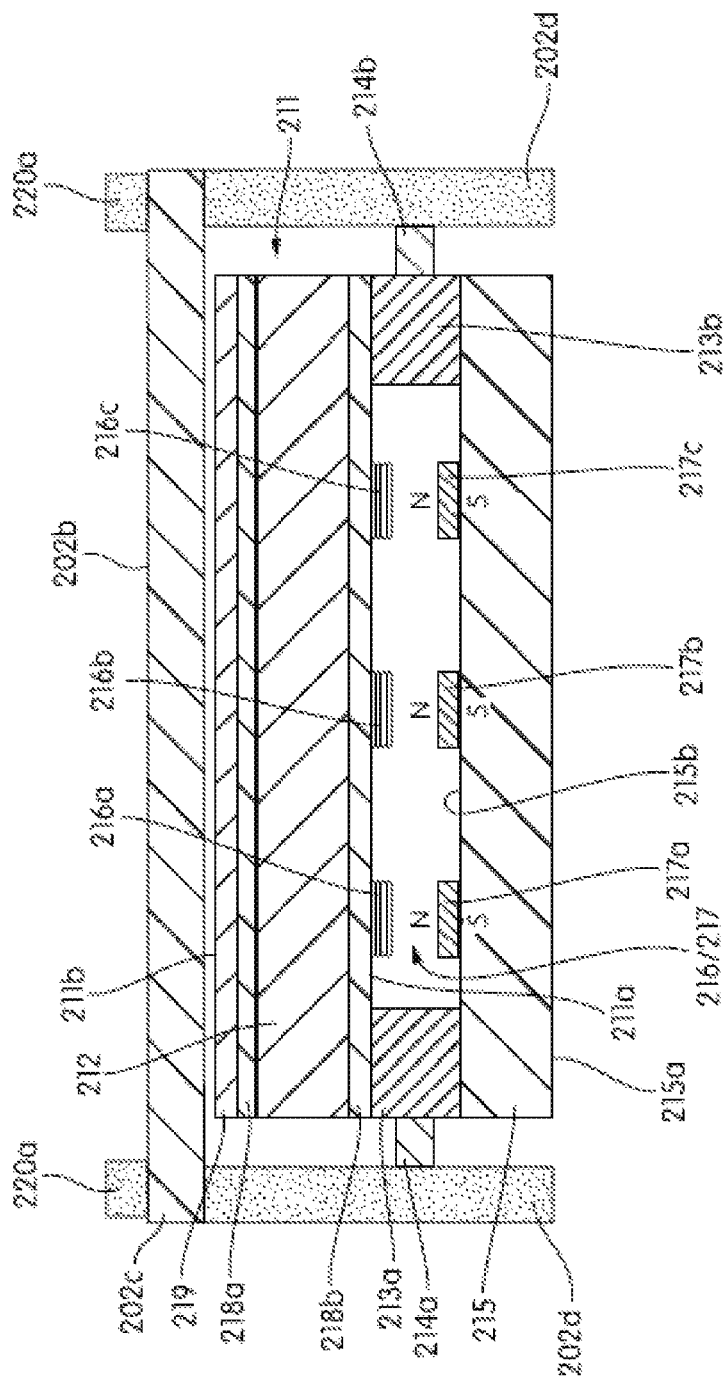

In an embodiment, the second layer 215 may form a substrate on or within which one or more elements of the second actuation component 216/217 are disposed. In an embodiment, the second actuation component 216/217 may be an electromagnet actuation component optimized to output a higher-frequency vibration, and may be activated at the same time as the first actuation component 211, or at a different time than the first actuation component 211. In an embodiment, the second layer 215 may comprise a plastic film. In an embodiment, the second layer 215 may be closer than the first actuation component 211 (and closer than the first layer 212) to an interior of the housing 202. For instance, if the haptic actuator 210 is disposed outside of the housing 202, as illustrated in FIG. 2A, a distance between the second layer 215 and an outer surface (e.g., 202a, 202b) is smaller than a distance between the first actuation component 211 and the outer surface of the housing 202, such that the second layer 215 is closer to an interior of the housing 202. In this situation, the second layer 215 would be disposed between the first layer 212 and an outer surface (e.g., 202b, 202a) of the housing 202. If, on the other hand, the haptic actuator 210 were disposed in an interior of the housing 202, as illustrated in FIGS. 5A and 5B below, a distance between the second layer 215 and a center of the housing 202 may be smaller than a distance between the first actuation component 211 and the center of the housing, such that the second layer 215 is still closer to the interior of the housing 202. In this situation, the first actuation component 211 would deform and push against the outer surface (e.g., 202b, 202a) of the housing 202, and the first actuation component 211 would be disposed between the second layer 215 and the outer surface (e.g., 202b, 202a) of the housing. In an embodiment, the haptic actuator 210 may be configured to be able to output actuation (e.g., vibration) that can be felt for a haptic-enabled device having a mass of several kilograms.

In an embodiment, the haptic actuator 210 may be formed as a thin or ultra-thin actuator. In some instances, the first actuation component 211, the second layer 215, and each of the spacers 213a, 213b may have thicknesses that are in a range of 100 μm and 1 mm (e.g., a thickness of 0.5 mm). In some instances, the first actuation component 211, the second layer 215, and each of the spacers 213a, 213b may have thicknesses that are in a range of 10 μm to 100 μm. In an embodiment, the first layer 212 of the first actuation component 211 may have a thickness that is in a range of 10 μm to 100 μm, or 100 μm to 1 mm. In embodiments hereof, the first layer 212, the second layer 215, and the spacers 213a, 213b may all have the same thickness, or may have different thicknesses.

In an embodiment, the one or more spacers 213a, 213b may create a suspension on which the first actuation component 211 is suspended on the one or more spacers 213a, 213b over the second layer 215. In an embodiment, one or more properties (e.g., thickness, level of resilience or elasticity, rigidity or softness, or shape) of the suspension may affect the ability of the haptic actuator 210 to generate a haptic effect. For instance, the thickness of the spacers 213a, 213b may affect a distance between elements of the second actuation component 216/217 (discussed below), which may affect the forces generated by the second actuation component 216/217. In another example, the level of resilience or elasticity of the material forming the spacers 213a, 213b may affect a resonance frequency or a bandwidth of the haptic actuator 210. Thus, the spacers 213a, 213b may be designed to achieve desired properties for the suspension. For instance, the spacers 213a, 213 may be designed to have materials that yield a resonance frequency for the haptic actuator 210 that is in a range of 1 Hz to 500 Hz.

As discussed above, the haptic actuator 210 may include a second actuation component 216/217 that is an electromagnet actuation component and that includes magnetized material of at least one permanent magnet (e.g., permanent magnets 217a, 217b, 217c) and at least one electromagnet (e.g., electromagnets 216a, 216b, 216c). In an embodiment, the permanent magnets 217a, 217b, 217c may have the same magnetized material (e.g., NdFeB or AlNiCo), or different magnetized materials. Each of the permanent magnets 217a, 217b, 217c may be formed substantially from only a magnetized material, or may be formed from a polymer or other encapsulating material that embeds a plurality of particles of a magnetized material (e.g., nano-magnets). In an embodiment, each of the plurality of electromagnets 216a, 216b, 216c may be formed from a coil of wire or other type of conductive coil. In an embodiment, the respective conductive coils may be formed by depositing a plurality of conductive layers and patterning each conductive layer into a turn of the respective coils. An insulating layer may be deposited between successive conductive layers. The turns of the respective coils may be electrically connected with conductive vias extending through the intermediate insulating layers, so as to form a continuous electrical path having a plurality of turns. In another embodiment, the respective conductive coils may each have been formed by wrapping a wire into a plurality of turns.

In an embodiment, when any electrical signal is applied to the one or more electromagnets 216a, 216b, 216c, the one or more electromagnets 216a, 216b, 216c may each generate a magnetic field that interacts with the magnetic field of the permanent magnets 217a, 217b, 217c. This interaction may cause relative movement between the magnetized material of the one or more permanent magnets 217a, 217b, 217c and the one or more electromagnets 216a, 216b, 216c. In an embodiment, an oscillating (also referred to as periodic) electrical signal may cause the relative movement to oscillate as well, between the electromagnets 216a, 216b, 216c moving closer to the permanent magnets 217a, 217b, 217c, and moving farther away from the permanent magnets 217a, 217b, 217c. In an embodiment, this oscillating relative movement between the electromagnets 216a, 216b, 216c and the permanent magnets 217a, 217b, 217c may cause oscillating movement (also referred to as vibration) in the first actuation component 211, because the electromagnets 216a, 216b, 216c are disposed on a surface 211a of the first actuation component 211. In an embodiment, if the first actuation component 211 and the second actuation component 216/217 are activated at the same time, the first actuation component 211 may exhibit both a static deformation (caused by the first layer 212 of actuatable material) and a vibration (caused by the relative movement between the electromagnets 216a, 216b, 216c and the permanent magnets 217a, 217b, 217c). In another embodiment, if the first actuation component 211 and the second actuation component 216/217 are activated at the same time, the first actuation component 211 may exhibit vibration that has a low frequency and high amplitude content (caused by the first layer 212 of actuatable material) and a high frequency and low amplitude content (caused by the relative movement between the electromagnets 216a, 216b, 216c and the permanent magnets 217a, 217b, 217c).

Figure 2B:
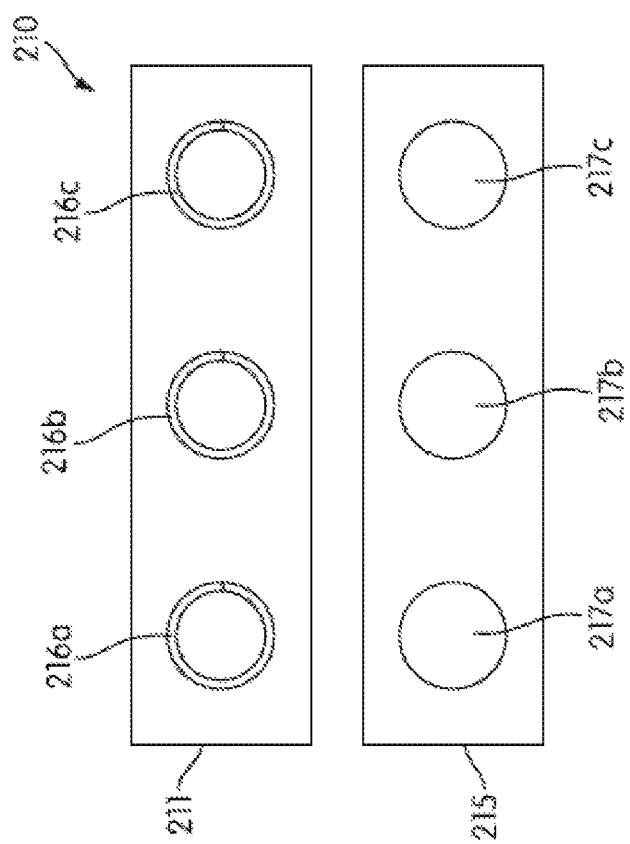

As illustrated in FIGS. 2A and 2B (which illustrates a plan view of the elements of the second actuation component 216/217), the permanent magnets 217a, 217b, and 217c may be formed as discrete patches, and the electromagnets 216a, 216b, 216c may also be formed as discrete patches. While the patches are shown to be circular in FIG. 2B, they may have any other shape (e.g., as square patches). In another embodiment, the haptic actuator 210 may have a single permanent magnet formed from a single patch of polymer having magnetized particles embedded therein. While FIGS. 2A and 2B illustrate a second actuation component 216/217 having a plurality of electromagnets 216a, 216b, 216c, and a plurality of permanent magnets 217a, 217b, 217c, which are each formed as a patch of magnetized material, another embodiment of the electromagnet actuation component 216/217 may have only a single electromagnet, a single permanent magnet, or a combination thereof.

In an embodiment, either the electromagnets 216a, 216b, 216c or the magnetized material of the permanent magnets 217a, 217b, 217c are disposed on a surface 211a of the first actuation component 211 (i.e., either, but not both, the electromagnets 216a-216c are disposed on the surface 211a, or the magnetized material is disposed on the surface 211a). For instance, in FIGS. 2A and 2B, the electromagnets 216a, 216b, 216c may be disposed on (e.g., adhered to) the surface 211a (which may be an inward-facing surface of the first actuation component 211), and the permanent magnets 217a, 217b, and 217c may be disposed on a surface 215b of the second layer 215 (which may be referred to as an outward-facing surface of the second layer 215). The components of the second actuation component 216/217 illustrated in FIGS. 2A and 2B may be limited to being disposed on only the surface 211a of the actuation component 211, or the second layer 215. The haptic actuator 210 of FIGS. 2A and 2B may be referred to as a two-layer haptic actuator. As discussed later in this disclosure, however, other embodiments may implement a three-layer haptic actuator that involves three layers that are all separated from each other (see FIG. 9).

In an embodiment, the electromagnets 216a, 216b, 216c or permanent magnets 217a, 217b, 217c may each have a thickness that is in a range of, e.g., 50 um to 1 mm. In an embodiment, the electromagnets 216a, 216b, 216c or permanent magnets 217a, 217b, 217c may be disposed on the outside of a particular layer (the second layer 215), or may be disposed partially or completely within the particular layer. When the electromagnets 216a, 216b, 216c or permanent magnets 217a, 217b, 217c are disposed within a particular layer, they may be completely embedded within the layer.

While FIGS. 2A and 2B illustrate the plurality of permanent magnets 217a, 217b, 217c being aligned with the plurality of electromagnets 216a, 216b, 216c, they may be out of alignment in other embodiments. For instance, some of the electromagnets 216a, 216b, 216c may be off-center relative to respective permanent magnets 217a, 217b, 217c. While FIGS. 2A and 2B illustrate the same number of permanent magnets and electromagnets, in other embodiments they may differ in number. For instance, another embodiment may include a single permanent magnet and three discrete electromagnets (see FIG. 4).

FIG. 2A further illustrates the electromagnets 216a, 216b, 216c being disposed on surface 211a, which may be referred to as a first surface 211a of the first actuation component. For instance, the electromagnets 216a, 216b, 216c may be adhered to the first surface 211a. The first surface 211a of the first actuation component 211 may be, e.g., an inward-facing surface of the first actuation component 211 that faces an inside or interior of the housing 202 of the haptic actuator 210. As discussed above, a second and opposite surface 211b of the first actuation component 211 may be an outward-facing surface that faces an exterior of the housing 202. For instance, that haptic actuator 210 can be disposed outside the housing 202, and the second surface 211b of the first layer 211 may be a surface that can contact a user's wrist. In an embodiment, the first surface 211a of the first layer 211 may face the second layer 215. More specifically, the second layer 215 may have a first surface 215a that is an inward-facing surface, and may have a second, opposite surface 215b that is an outward-facing surface. The first surface 211a may face the second surface 215b. As depicted in FIG. 2A, the permanent magnets 217a, 217b, 217c may be disposed on (e.g., adhered to) the second surface 215b of the second layer 215, while the plurality of electromagnets are disposed on the first surface 211a of the first actuation component 211. In this arrangement, the plurality of electromagnets 216a, 216b, 216c may face the plurality of permanent magnets 217a, 217b, 217c.

In an embodiment in which the haptic actuator 210 is disposed outside of the housing 202, the haptic actuator 210 may be disposed on the rear outer surface 202b of the housing 202, as illustrated in FIGS. 1B and 2A. As FIG. 2A illustrates, the first surface 215a of second layer 215 may be in contact with and adhered to the rear outer surface 202b of FIG. 1B, wherein the rear outer surface 202b is formed from a layer 202c (e.g., a layer of flexible material) of the housing 202. In another example, the haptic actuator 210 may be suspended just over the rear outer surface 202b of the housing 202, and the first surface 215a of the second layer 215 is not directly in contact with the rear outer surface 202b. For instance, the haptic actuator 210 may be suspended over the rear outer surface 202b via the plurality of tabs 214a, 214b. The tabs 214a, 214b may be considered part of the haptic actuator, or may be considered to be elements that are separate from the haptic actuator 210. In an embodiment, one or both of the second layer 215 and the housing layer 202c are rigid. In an embodiment, one or both of the second layer 215 and the housing layer 202c are flexible.

Referring again to FIG. 2A, the haptic-enabled device 200 may include one or more signal generators, such as first and second signal generators 232, 234. The first and second signal generators 232, 234 may be considered part of the haptic actuator 210 (e.g., part of a control unit 230), or may be considered separate therefrom. In an embodiment, an output of the second signal generator 234 may be electrically connected to electrode 218a of the first actuation component 211, and an output of the first signal generator 232 may be electrically connected to each of the electromagnets 216a, 216b, 216c. The second signal generator 234 may thus drive the first actuation component 211, while the first signal generator 232 may drive the second actuation component 216/217. As discussed above, the electrode 218b may provide a ground potential for the first and second actuation components 211, 216/217. In an embodiment, activation of the first and second signal generators 232, 234 may be controlled by the control unit 230. The first and second signal generators 232, 234 may be activated at the same time (i.e., simultaneously), or activated during different respective time periods. If the first and second signal generators 232, 234 are able to vary a frequency, intensity, or other parameter of an electrical signal that is output from the first and second signal generators 232, 234, the control unit 230 may be configured to control a value of such parameters. As discussed above with respect to the control unit 130, the control unit 230 may include a microprocessor, PLA, FPGA, or any combination thereof. In an embodiment, the signal generators 232, 234 may be capable of providing sufficient voltage and/or current to the first actuation component 211 and the second actuation component 216/217, respectively. For instance, if the first actuation component 211 operates at 1 kV or higher, the signal generator 234 may be configured to generate a signal that is at least 1 kV in amplitude. In an embodiment, the signal generators 232, 234 may output signals that have amplitudes lower than a level at which the first actuation component 211 or second actuation component 216/217 operate. In such a situation, an amplifier may be combined with the signal generators 232, 234. The amplifier may amplify an output of the signal generators 232, 234 to a the level at which the first actuation component 211 or second actuation component 216/217 operates.

Figure 2C:
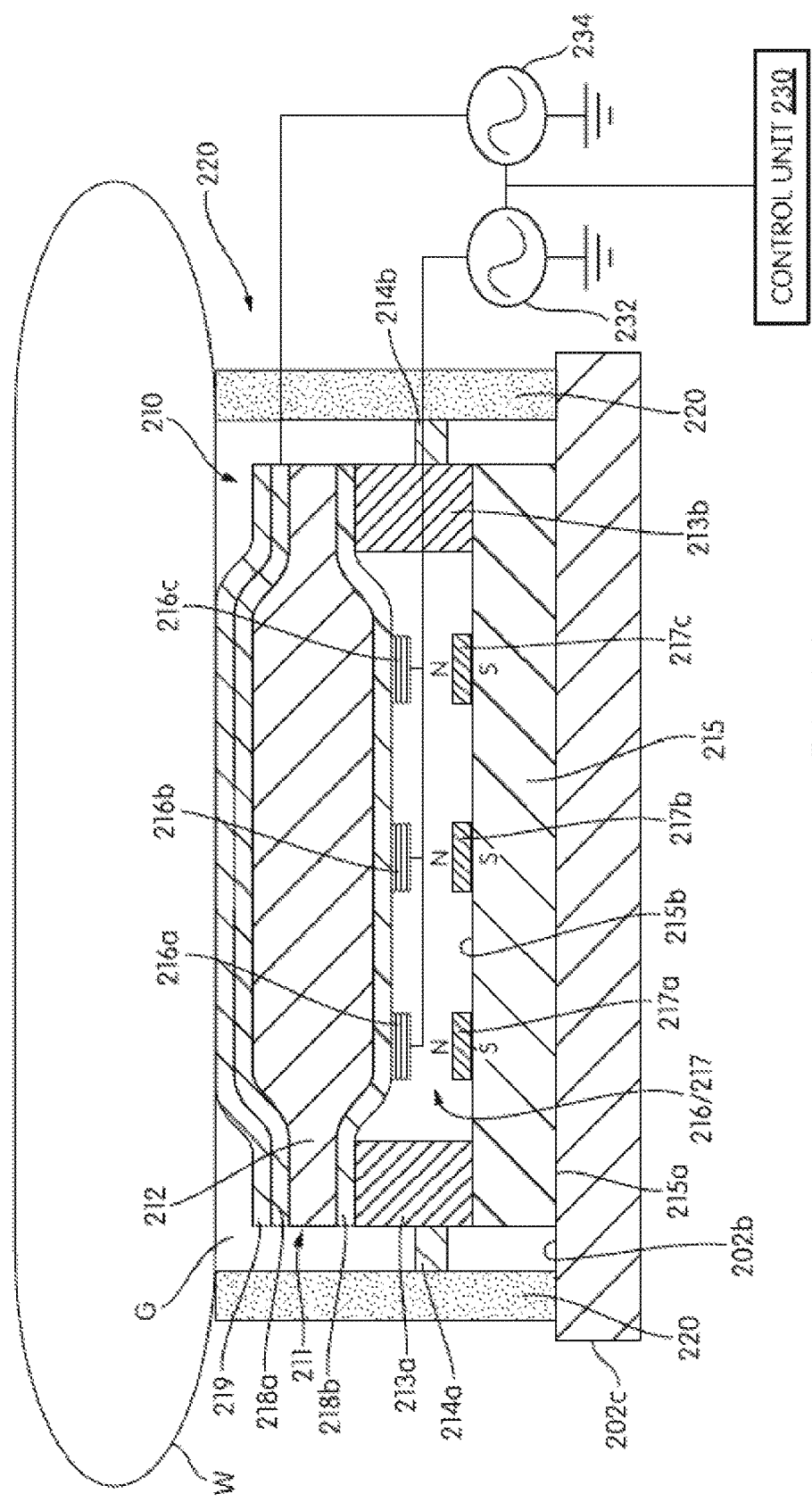
FIG. 2C illustrates a view of a haptic actuator, according to an embodiment hereof.

As discussed above, the first actuation component 211 may, in an embodiment, be used to output low-frequency content (e.g., a low-frequency vibration) or a static deformation for a haptic effect. To output a static deformation, the control unit 230 may control the second signal generator 234 to output a direct current (DC) signal (e.g., a 1 kV DC signal). To output a low-frequency content, such as a haptic content in a range of, e.g., 1 Hz to 5 Hz, the control unit 230 may control the second signal generator 234 to output a periodic electrical signal or other oscillating electrical signal (e.g., a sinusoidal signal) that has a frequency in a range of 1 Hz to 5 Hz, so as to cause the first layer 212 of actuatable material to deform at the same frequency or substantially the same frequency as the electrical drive signal. Each cycle of the periodic electrical signal may cause the first layer 212 of actuatable material (e.g., an EAP material) to deform outwardly (e.g., bulge outward) and contact a user's wrist, and then return to an undeformed state. For instance, FIG. 2C illustrates a state in which a DC or low-frequency electrical signal has been applied to electrode 218a to cause the first layer 212 of actuatable material of the first actuation component 211 to deform outwardly. If the electrical signal is a low-frequency periodic signal, some users may feel a tap from the actuatable material for each cycle of the periodic signal. The control unit 230 may thus, in an embodiment, be configured to control how many cycle(s) of the periodic signal are output, in order to control how many taps are in the haptic effect. The control unit 230 may further be configured to control a frequency (e.g., 3 taps in 1.5 seconds) and/or amplitude of the tapping imparted to a user's wrist by controlling a frequency and/or amplitude of the electrical signal output by the second signal generator 234, as discussed above.

As discussed above, the second actuation component 216/217 may use interaction between magnetic fields to create relative movement between the electromagnets 216a, 216b, 216c and the permanent magnets 217a, 217b, 217c. For instance, the permanent magnets 217a, 217b, 217c may exert a magnetic force on the electromagnets 216a, 216b, 216c that causes the electromagnets 216a, 216b, 216c to move closer to or farther away from the permanent magnets 217a, 217b, 217c. The relative movement between the electromagnets 216a, 216b, 216c and the permanent magnets 217a, 217b, 217c may, in an embodiment, be used to produce low-frequency content or high-frequency content (e.g., low-frequency or high-frequency vibrotactile content) for a haptic effect. For instance, the control unit 230 may control the first signal generator 232 to output a periodic electrical signal that has a frequency in a range of, e.g., 1 Hz to 200 Hz, or 5 Hz to 100 Hz. The electrical signal that is output from the first signal generator 232 may be applied to each of the electromagnets 216a, 216b, 216c, as depicted in FIG. 2A, or to only a subset of the electromagnets 216a, 216b, 216c selected by the control unit 230. When the electrical signal is applied to the electromagnets 216a, 216b, 216c, each of the electromagnets 216a, 216b, 216c may generate a respective magnetic field. The polarity of the magnetic field of a respective electromagnet may depend on a direction of the electrical current being applied to the electromagnet. If the electrical signal is periodic, the electrical current created by the electrical signal may periodically change directions, thus periodically changing the polarity of the magnetic field of a respective electromagnet.

Figure 2D:
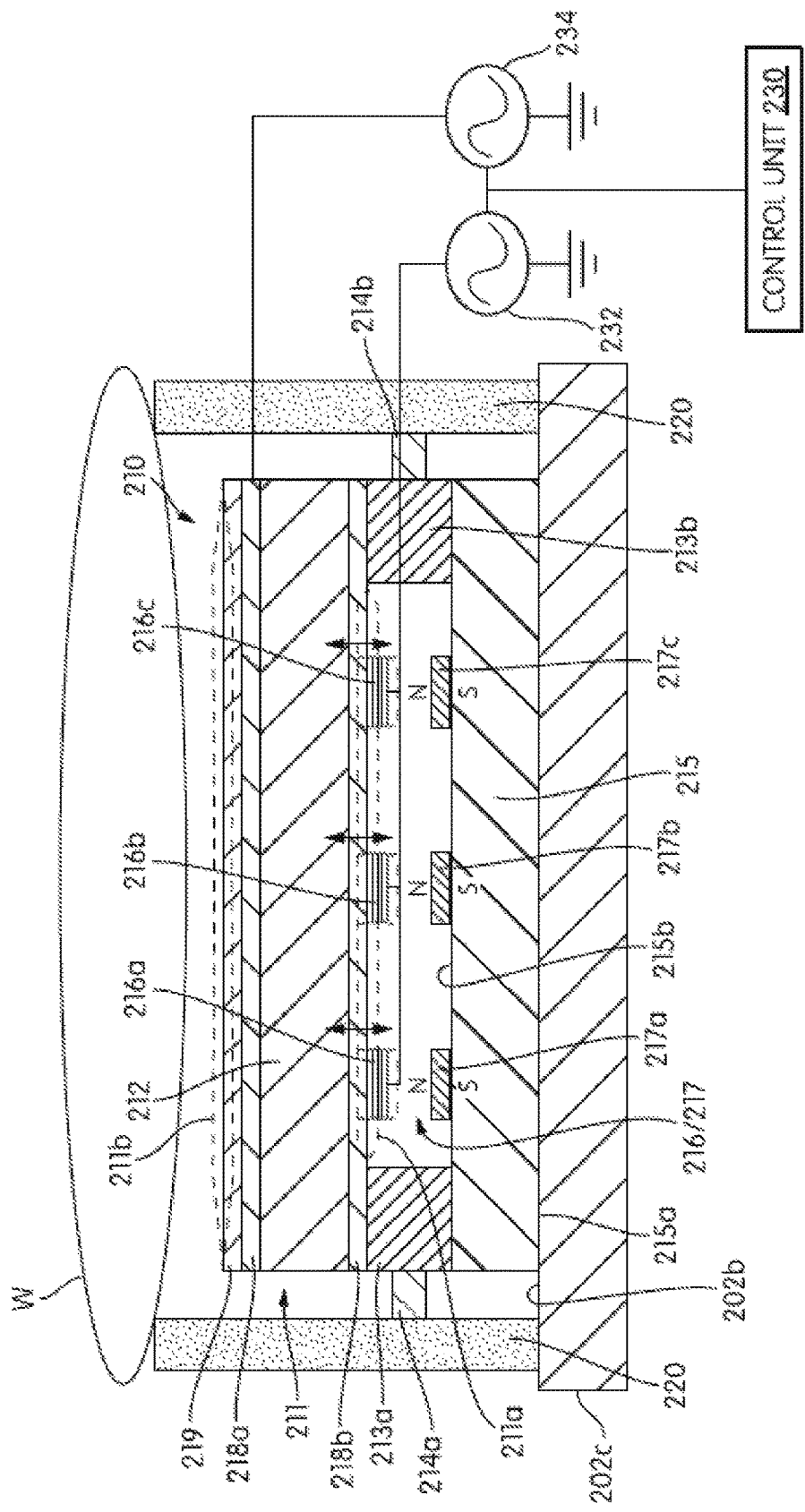
FIG. 2D illustrates a view of a haptic-enabled device, according to an embodiment hereof.

In an embodiment, when each magnetic field of the magnetic fields generated by the electromagnets 216a, 216b, 216c has a first polarity (e.g., a N-S polarity), the electromagnets 216a, 216b, 216c may be attracted to the permanent magnets 217a, 217b, 217c. As a result, the electromagnets 216a, 216b, 216c may move toward the permanent magnets 217a, 217b, and 217b. In an embodiment, when the magnetic fields generated by the electromagnets 216a, 216b, 216c have a second polarity (e.g., a S-N polarity) that is opposite of the first polarity, the electromagnets 216a, 216b, 216c may be repelled or otherwise pushed by the permanent magnets 217a, 217b, 217c. If the electrical signal being applied to the electromagnets 216a, 216b, 216c is oscillating, the magnetic fields generated by them may also periodically switch between the first polarity and the second, opposite polarity. As a result, the electromagnets 216a, 216b, 216c may alternate between being pulled towards the permanent magnets 217a, 217b, 217c and being pushed by the permanent magnets 217a, 217b, 217c. As a result, the electromagnets 216a, 216b, 216c may vibrate, as illustrated in FIG. 2D. As FIG. 2D shows, the electromagnets 216a, 216b, 216c may vibrate in an up-and-down motion. A frequency of the vibration may depend on the frequency of the signal from the first signal generator 232. If the electromagnets 216a, 216b, 216c are disposed on a surface 211a of the first actuation component 211, the vibration of the electromagnets 216a, 216b, 216c may be transferred to the first actuation component 211, to the housing 202, or any combination thereof. FIG. 2D illustrates such a transfer, in which the electromagnets 216a, 216b, 216c alternate between pushing the layers of the first actuation component 211 toward the upper dashed line, and pulling the layers of the first actuation component 211 toward the lower dashed line. Accordingly, the relative movement between the magnetized material of the permanent magnets 217a-217c and the one or more electromagnets 216a-216d thus causes vibration of the first actuation component 211. Thus, the relative movement generated in the second actuation component 216/217 may generate vibrotactile content for a haptic effect.

In an embodiment, the pull or push exerted by the electromagnets 216a, 216b, 216c on the surface 211a of the first actuation component may cause deformation of one or more layers of the first actuation component, but on a smaller level than deformation generated by the first actuation component 211 itself. For instance, the relative movement between the electromagnets 216a, 216b, 216c and the permanent magnets 217a, 217b, 217c may push or pull the first actuation component by an amount that is 10 to 100 times smaller than an amount of deformation caused by applying an electrical drive signal to the first layer 212 of actuatable material.

In an embodiment, the deformation shown in FIG. 2C may be combined with the vibration shown in FIG. 2D, such as by activating the signal generators 232 and 234 simultaneously. In such a case, the first actuation component 211 may cause the first layer 212 of actuatable material to deform in a static or low-frequency (e.g., 1 Hz) manner. A user may perceive the deformation on his or her wrist and perceive the deformation as one or more taps. Simultaneously, the second actuation component 216/217 causes a high-frequency movement (e.g., 100 Hz), but at a smaller level or amplitude compared to the deformation generated by the first actuation component 211. The high-frequency movement may create a vibration that also transfers to the layers of the first actuation component 211. As a result, a user may perceive one or more taps and a high-frequency vibration at the same time. In an embodiment, the frequency of the electrical signal applied from the first signal generator 232 to the electromagnets 216a, 216b, 216c may be substantially the same as the resonance frequency of the suspension the spacers 213a, 213b.

In an embodiment, the control unit 230 may be configured to cause the first signal generator 232 to apply a first electrical signal that is a comparatively high frequency signal to the electromagnets 216a, 216b, 216c, and may cause the second signal generator 234 to apply a second electrical signal that is a comparatively low frequency signal to the first layer 212 of actuatable material. For instance, the frequency of the first electrical signal from generator 232 may be substantially equal to a desired frequency of vibration (e.g, 100 Hz). In an embodiment, the amplitude of the first electrical signal may be substantially lower than the amplitude of the second electrical signal (e.g., 10 or 100 times lower).

In the example above, the second electrical signal may be a periodic signal that has a frequency that is substantially equal to a desired frequency of the tapping (e.g., 2 Hz). The second electrical signal may further have an amplitude that is sufficiently high (e.g., 1 kV) to cause the first layer 212 of actuatable material (e.g., PVDF or other EAP material) to exhibit sufficient deformation. For instance, the first layer 212 of actuatable material may need to deform by a sufficient amount (e.g., 5 mm) to cause the outward-facing surface 211b to extend beyond a top edge of the spacer 220, so that the first actuation component 211 can come into contact with a user's wrist and impart a tapping sensation when the haptic-enabled device 200 is being worn.

In an embodiment, the electrical signal that is output by the first signal generator 232 and the electrical signal that is output by the second signal generator 234 may have the same amplitude and/or frequency. In an embodiment, the electrical signal that is output by the first signal generator 232 and the electrical signal that is output by the second signal generator 234 may have different frequencies, different amplitudes, or a combination thereof. In an embodiment, the first actuation component 211 and the second actuation component 216/217 may share a single signal generator, such that there is only one signal generator in the haptic actuator 210.

Figure 3:
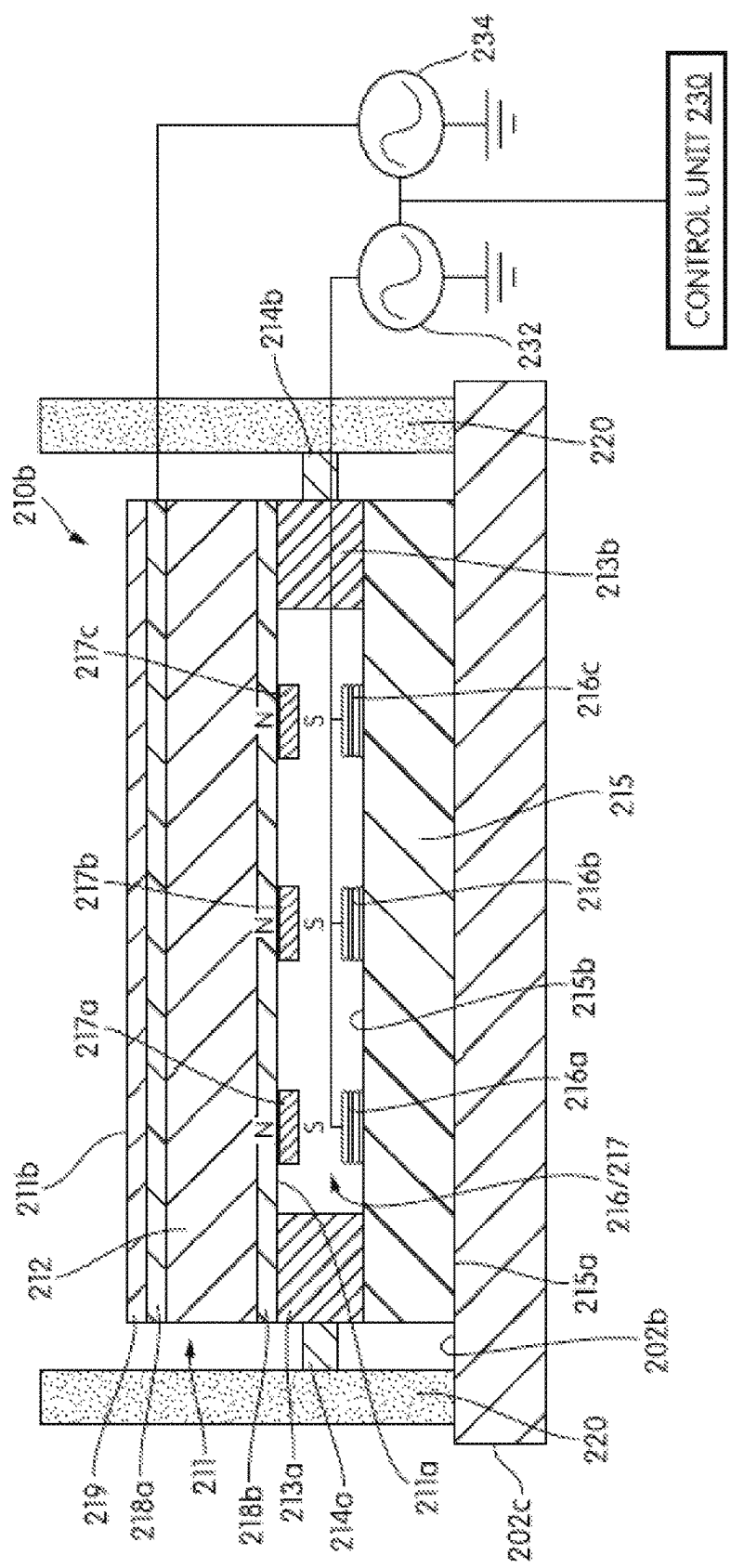
FIG. 3 illustrates a view of a haptic actuator, according to an embodiment hereof.

FIG. 3 illustrates an embodiment of a haptic actuator 210b that reverses the placement of the electromagnets 216a, 216b, 216c and the permanent magnets 217a, 217b, 217c relative to the placement in FIG. 2A. Similar to the embodiment shown in FIG. 2A, the haptic actuator 210b of FIG. 3 has the first actuation component 211. Further, the haptic actuator 210b has a second actuation component 217/216 that includes permanent magnets 217a, 217b, 217c and electromagnets 216a, 216b, 216c. In FIG. 3, however, the placement of the electromagnets 216a, 216b, 216c and the permanent magnets 217a, 217b, 217c are reversed, such that the permanent magnets 217a, 217b, 217c are disposed on the inward-facing surface 211a of the first actuation component 211, and the electromagnets 216a, 216b, 216c are disposed on the second surface 215b of the second layer 215. The haptic actuator 210b of FIG. 3 may be activated in a manner similar to that of the haptic actuator 210 of FIG. 2A.

Figure 4:
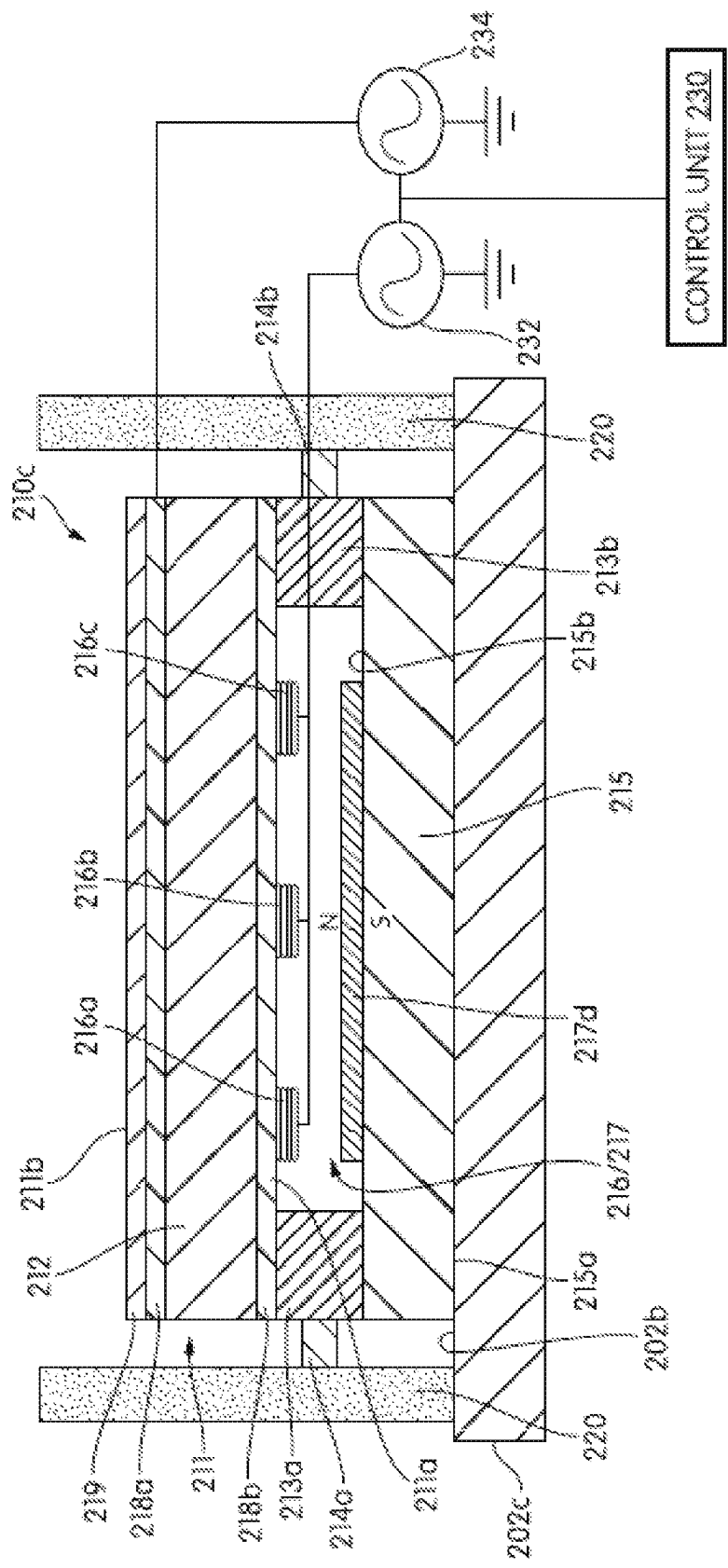
FIG. 4 illustrates a view of a haptic actuator, according to an embodiment hereof.

In FIGS. 2A and 3, as noted above, the second actuation component includes a plurality of discrete permanent magnets 217a, 217b, 217c, which may be formed as a plurality of separate patches. Each of the patches may include magnetized particles embedded in an encapsulating material (e.g., a polymer), or may include solid pieces of only magnetized material (e.g., magnetized neodymium material or magnetized AlNiCo material). FIG. 4 illustrates a haptic actuator 210c that includes an second actuation component 216/217d that is an electromagnet actuation component having a single permanent magnet 217d, which may be formed as a single patch of magnetized material. In an embodiment, the patch of FIG. 4 may be the only patch of permanent magnet included in the haptic actuator 210c. In the embodiment of FIG. 4, the second actuation component 216/217d may have a greater number of discrete electromagnets (e.g., three electromagnets 216a, 216b, 216c) than the number of discrete permanent magnet(s) (e.g., one permanent magnet 217d). In an embodiment, during the manufacturing of haptic actuators 210, 210b, 210c, any of the electromagnets 216a, 216b, 216c or permanent magnets 217a, 217b, 217c, 217d may be pre-fabricated and then disposed on or within the first layer 211 or the second layer 215, or may be formed directly on the first layer 211 or the second layer 215 through, e.g., a chemical deposition process.

FIG. 5A depicts a haptic-enabled device 200a in which the haptic actuator 210 is disposed inside a housing 202 of the device. Like the haptic-enabled device 200 illustrated in FIG. 1B, the haptic-enabled device 200a may also be an electronic watch having the housing 202 and strap 204. Like in FIG. 1B, the housing 202 of the haptic-enabled device 200a may also have a first outer surface 202a (e.g., a front outer surface that includes an outer surface of a display device) and a second outer surface 202b (e.g., a rear outer surface that contacts the user's wrist). In FIG. 5A, The haptic actuator 210 of the haptic-enabled device 200a may be disposed within the housing 202 and adjacent to a layer that forms the rear outer surface 202b. The housing 220 may further have a rim-shaped spacer 220a that extends outwardly past the rear outer surface 202b. As depicted in FIG. 5B, the spacer 220a may be shorter than the spacer 220 of FIGS. 1B and 2A.

FIG. 5B illustrates a sectional view of the haptic-enabled device 200a along the line B-B in FIG. 5A. The figure illustrates the haptic actuator 210 being disposed adjacent to a layer 202c that forms the rear outer surface 202b of the housing. More specifically, the haptic actuator 210 may be placed such that the outward-facing surface 211b of the first actuation component 211 (which may also be an outer surface of the actuator 210) is in contact with an inner surface of the layer 202c. In another embodiment, there may be a gap between the outward-facing surface 211b and the inner surface of the layer 202c. In an embodiment, the layer 202c may be a flexible layer, so that when the first actuation component 211 causes a deformation of its first layer 212 of actuatable material, the layer 202c also deforms. In an embodiment, the housing 202 may have the spacer 220a so as to reduce dampening from a user's wrist, and to provide a gap into which the layer 202c can deform. FIG. 5B further depicts the haptic actuator 210 being attached to a wall 202d of the cylindrical housing 202 via the tabs 214a, 214b. In other embodiments, the haptic actuator 210 may be mounted inside the housing 202 in a different manner.

Figure 6B:
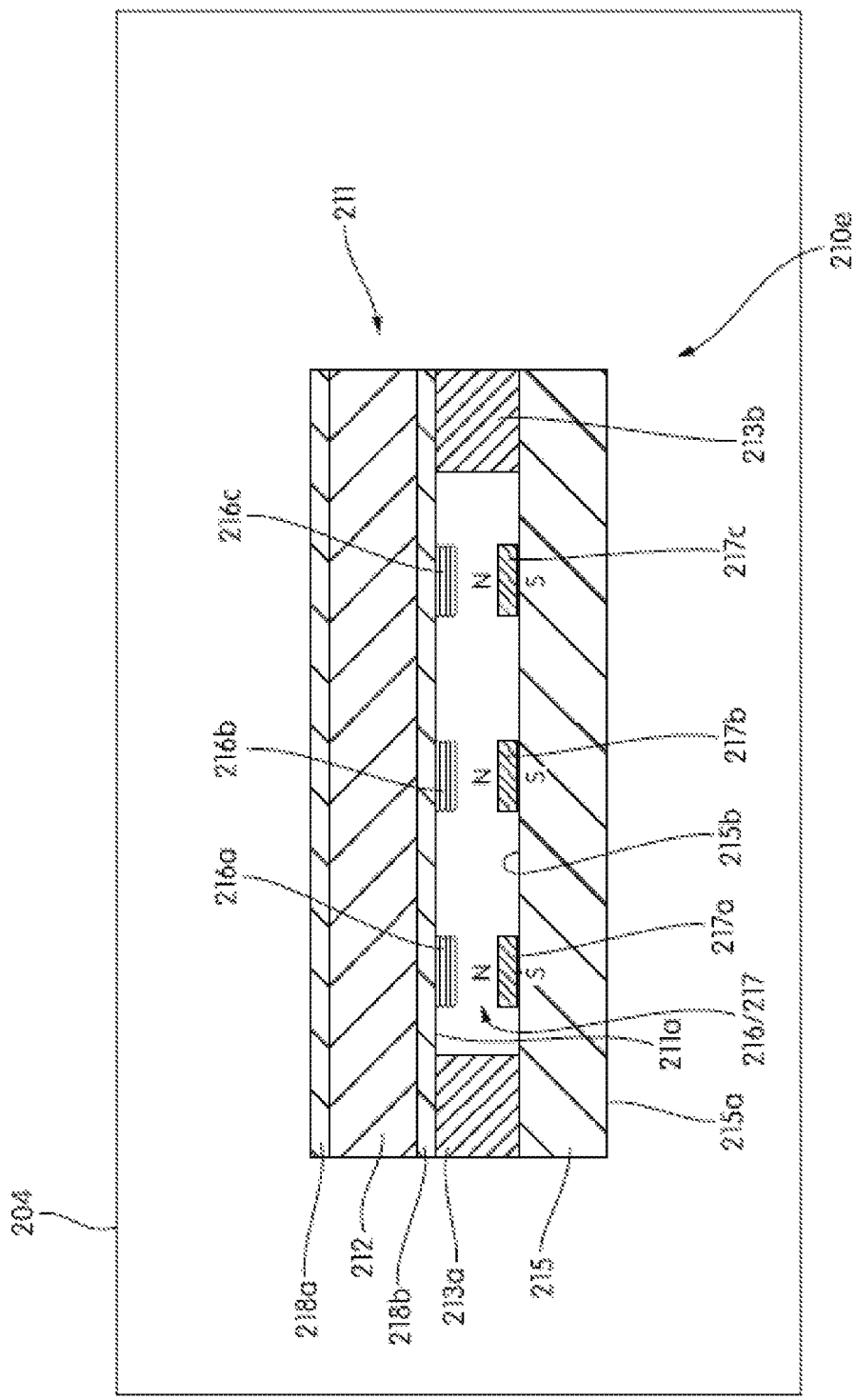

FIG. 6A shows a haptic actuator 210e disposed within (e.g., embedded in) a strap of a haptic-enabled device 200b. The haptic actuator 210e may also be configured to generate a haptic effect that can be felt at a user's wrist. FIG. 6B illustrates a sectional view of the haptic actuator 210e embedded within a material of the strap 204. The haptic actuator 210e is similar to the haptic actuator 210 of the other figures. More specifically, the haptic actuator 210e also includes the first actuation component 211 and the second actuation component 216/217. However, the haptic actuator 210e may omit the tabs 214a, b, which may be unnecessary because the haptic actuator 210e is embedded within the strap 204, as opposed to being attached to a structure of a housing 202. In another embodiment, the haptic actuator 210e may attached to an outer surface of the strap 204, such that the haptic actuator 210e is in contact with the outer surface and is located outside of the strap 204.

Figure 7B:
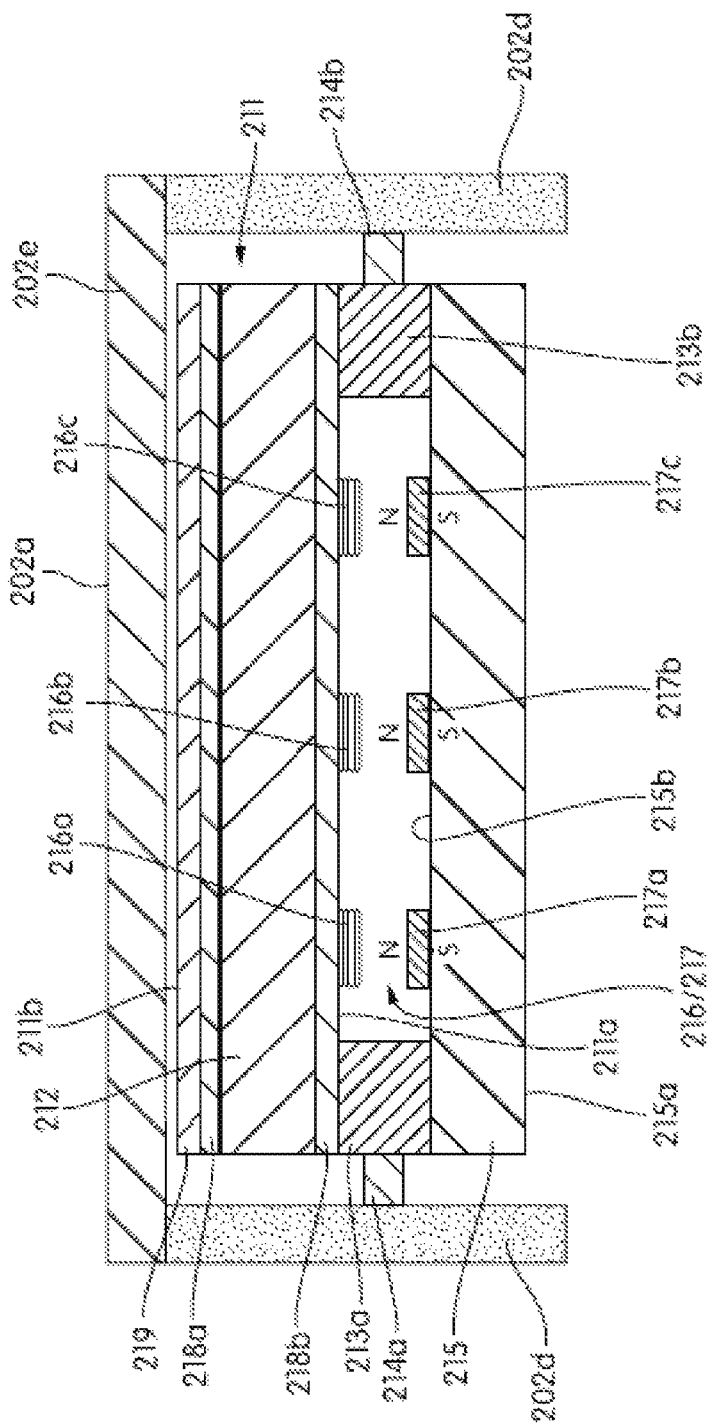

FIG. 7A illustrates a haptic-enabled device 200c in which a haptic actuator 210 is disposed adjacent to a front outer surface 202a of a housing 202 of the haptic-enabled device 200c. FIG. 7B illustrates a sectional view along the line B-B in FIG. 7A. In FIG. 7B, the front outer surface 202a of the housing 202 may be formed by flexible display layer 202e, such as a flexible organic light emitting device (OLED) layer. In FIG. 7B, the haptic actuator 210 is disposed within the housing 202. In another embodiment, the haptic actuator 210 may be disposed outside of the housing 202, and may be substantially transparent (e.g., have a transparency of 70% or more) so that the display layer 202e is viewable through the haptic actuator 210.

As FIG. 7B, the haptic actuator 210 may be attached to a wall 202d of the housing 202 via the tabs 214a, 214b. In other embodiments, the haptic actuator 210 may be mounted within the housing 202 in some other manner. The haptic actuator 210 may be located so that its outer surface (e.g., the outward-facing surface 211b of the first actuation component 211) is in contact with an inward-facing surface of the display layer 202e (which may be an inner surface of the housing 202). In another embodiment, there may be a gap between the outer surface of the haptic actuator 210 and an inner surface of the housing 202. The gap may be small enough such that a deformation of the first actuation component 211 will still cause the display layer 202e to deform.

Any of the embodiments herein may be combined. For instance, a haptic-enabled device may combine haptic-enabled devices 200, 200a, 200b, 200c by having a plurality of haptic actuators that are disposed at a variety of locations, such as a location that is adjacent to a rear outer surface of the housing and a location that is embedded with a strap of the device.

Figure 8B:
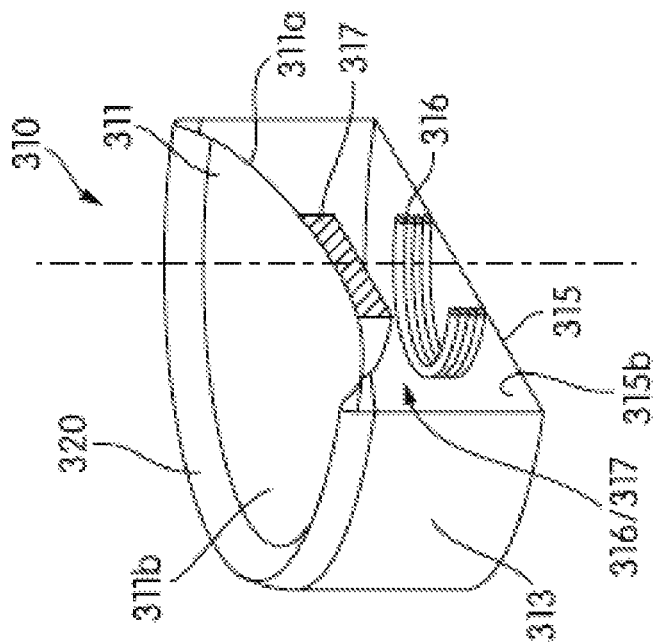
FIGS. 8A and 8B illustrate views of a haptic actuator, according to an embodiment hereof.
Figure 8A:
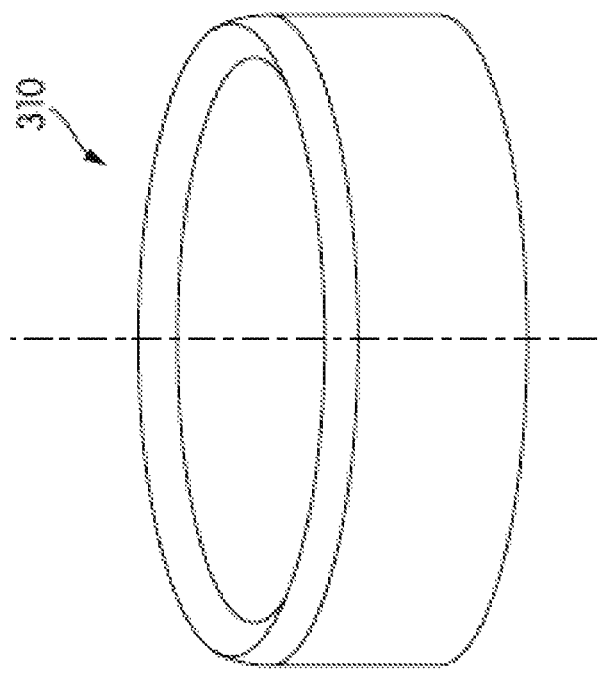

In an embodiment, the haptic actuator 210 may have a rectangular shape, as most clearly illustrated in FIG. 1B. In an embodiment, as illustrated in FIGS. 8A and 8B, a haptic actuator 310 may have a cylindrical shape. The cylindrical haptic actuator 310 also includes, for instance, a first actuation component 311 that is a smart material actuation component, and includes a second actuation component 316/317 that is an electromagnet actuation component. More specifically, the haptic actuator 310 includes a first actuation component 311 that is separated from a layer 315 by a first spacer 313, which may be a single spacer. The first actuation component 311 may include an actuatable material (e.g., smart material such as PVDF) that is configured to deform upon an electrical signal being applied thereto. The second actuation component 316/317 includes an electromagnet 316 and a permanent magnet 317. The permanent magnet 317 may be disposed on an inside-facing surface 311a of the first actuation component 311, while the electromagnet 316 may be disposed on an inside-facing surface 315b of the layer 315.

FIGS. 8A and 8B further depict a second spacer 320 that extends outwardly past an outward-facing surface 311b of the first actuation component 311. The spacer 320 in this embodiment may be part of the actuator 310, rather than part of a housing (e.g., 202) of a haptic-enabled device. The spacer 320 may provide space between the outward-facing surface 311b of the first actuation component 311 and an external object (e.g., a user's wrist or other body part) that the spacer 320 may come into contact with. In an embodiment, the first spacer 313 and the second spacer 320 may be parts of an integral structure, and may have been formed in the same manufacturing step. In an embodiment, the first spacer 313 and the second spacer 320 may be two discrete structures that are separately formed and then attached to each other.

Figure 9:
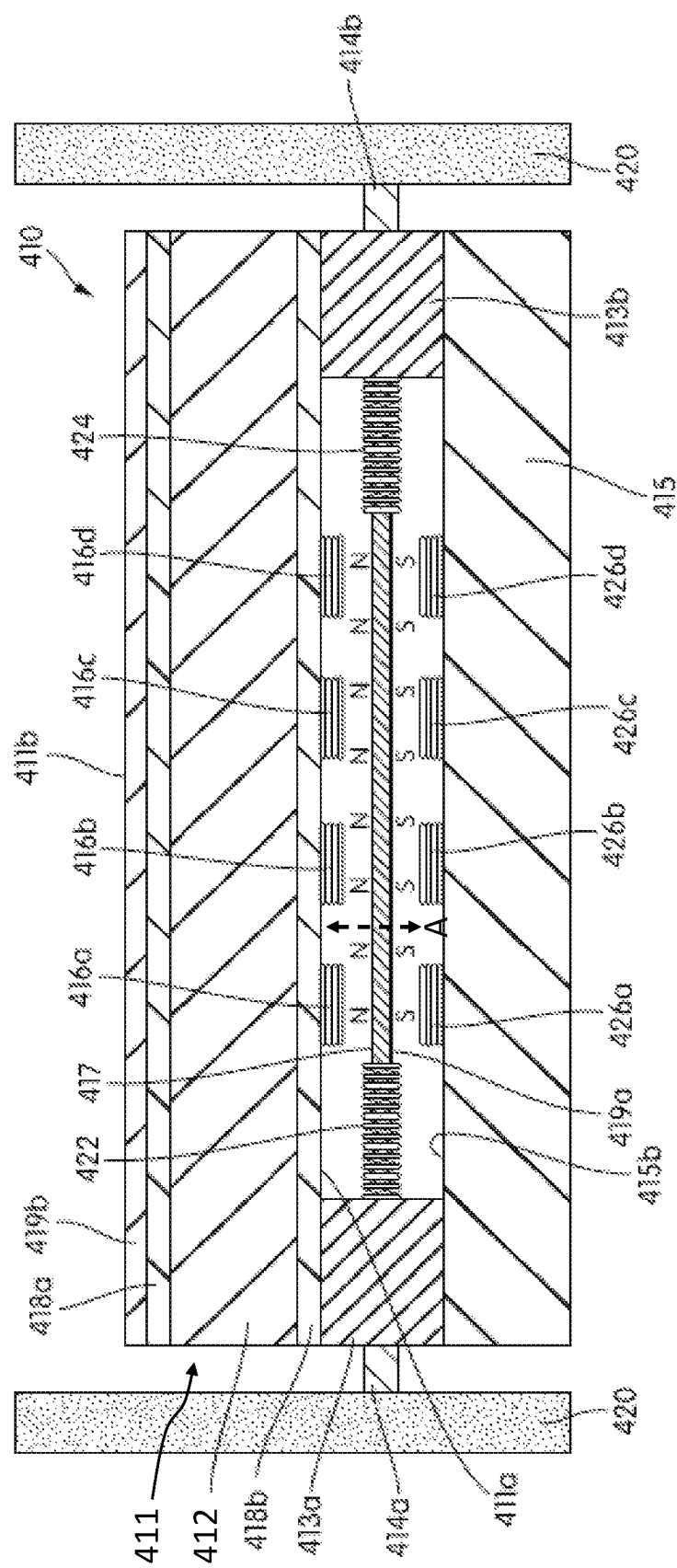
FIG. 9 illustrates a sectional view of a haptic actuator, according to an embodiment hereof.

FIG. 9 illustrates an embodiment of a three-layer actuator, which has three layers that are separated from each other. More specifically, FIG. 9 illustrates a haptic actuator 410 that has a first actuation component 411 that is, e.g., a smart material actuation component, and a second actuation component 416/417/426 that is, e.g., an electromagnet actuation component. The first actuation component 411 includes a first layer 412 of actuatable material (e.g., PVDF) sandwiched between two electrodes 418a, 418b. The second actuation component 416/417/426 includes electromagnets 416a, 416b, 416c, 416d disposed on an inside-facing surface 411a of the first actuation component 411. It further includes electromagnets 426a, 426b, 426c, 426d disposed on an inward-facing surface 415b of a second layer 415. Additionally, the second actuation component 416/417/426 includes magnetized material of a permanent magnet 417 disposed on a third layer 419a. In an embodiment, the third layer 419a includes a flexible material (e.g., polyimide), and the permanent magnet 417 is mounted on the third layer 419a. In an embodiment, the third layer 419a is a flexible material that embeds the magnetized material of the permanent magnet 417. The third layer 419a may be disposed between the first layer 412 and the second layer 415. The first layer 412, second layer 415, and third layer 419a may all be separated from each other. Accordingly, the actuator 410 may be referred to as a three-layer actuator.

In FIG. 9, the haptic actuator 410 further includes a plurality of spacers 413a, 413b and an insulating layer 419b. The plurality of spacers 413a, 413b may separate the first actuation component 411 and the second layer 415, and provide space in which to suspend the third layer 419a between the first actuation component 411 and second layer 415. The insulating layer 419b may be disposed on electrode 418a, and may form an outward-facing surface 411b of the first actuation component 411. In an embodiment, the insulating layer 419b may be omitted.

In an embodiment, the first actuation component 411 may include the first layer 412 of actuatable material that is configured deform when an electrical potential is generated across the first layer 412 of actuatable material, such as by applying an electrical signal (e.g., from signal generator 234 of FIGS. 2A through 4) to the electrode 418a while using electrode 418b as a ground electrode. In an embodiment, the second actuation component 416/417/426 includes the first set of electromagnets 416a-416d, the permanent magnet 417, and the second set of electromagnets 426a-426d, as stated above. The first set of electromagnets 416a-416d and the second set of electromagnets 426a-426d may be disposed on a respective first surface (e.g., 411a) and second surface (e.g., 415b) that face each other. In an embodiment, each electromagnet of the first set of electromagnets 416a-416d and the second set of electromagnets 426a-426d may be a conductive coil, and may be configured to generate a magnetic field when an electrical signal is applied to the respective electromagnet. In an embodiment, the first set of electromagnets 416a-416d may be electrically connected to a first signal generator, and the second set of electromagnets 426a-426d may be electrically connected to a second signal generator, or also electrically connected to the first signal generator. Further, in this embodiment, the first layer 412 of actuatable material may be electrically connected to a third signal generator. When the first signal generator and/or the second signal generator is activated, relative movement between the permanent magnet 417 and any set of the first set of electromagnets 416a-416d and the second set of electromagnets 426a-426d may be created.

As further illustrated in FIG. 9, the third layer 419a that supports (or is part of) the permanent magnet 417 may be disposed between the first actuation component 411 and the second layer 415. In an embodiment, the third layer 419a may include magnetized particles embedded in an encapsulating material (e.g., a polymer). In an embodiment, the third layer 419a may be formed from a single piece of only magnetized material. In an embodiment, the third layer 419a may be suspended within or otherwise attached to the haptic actuator 410 via a spring-like element or material, such as one or more springs 422, 424 or other elastic material (e.g., an elastomer). The spring-like element or material may allow the permanent magnet 417 as well as the third layer 419a to move relative to the first set of electromagnets 416a-416d and relative to the second set of electromagnets 426a-426d. Such a movement may vibrate the third layer 419a, and such a vibration may transfer to the first actuation component 411 or to another component of the actuator 410. As a result, a vibrotactile effect is generated.

In an embodiment, the spring-like element or material may attach the third layer 419a to the spacers 413a, 413b. In an embodiment, each of the first layer 412, the second layer 415, and the third layer 419a may have a thickness that is in a range from 10 um to 100 um, or from 100 um to 1 mm. In an embodiment, the haptic actuator 410 may be attached to a spacer 420 via tabs 414a, 414b. The spacer 420 may be similar to the spacer 220 in FIG. 1B, and may be used to provide clearance between the outward-facing surface 411b of the first actuation component 411 and an object in contact with the spacer 420.

In an embodiment, a control unit (e.g., control unit 230) may selectively activate only one set of the first set of electromagnets 416a-416d and the second set of electromagnets 426a-426d, or may selectively activate both the first set and the second set of electromagnets 416a-416d, 426a-426d. In an embodiment, when only one set (e.g., the first set of electromagnets 416a-416d) of the first set of electromagnets 416a-416d and the second set of electromagnets 426a-426d is activated, the resulting magnetic fields may cause the permanent magnet 417 of the third layer 419a to move along an axis A that is perpendicular to a surface (e.g., 411a) of the first actuation component 411, to a surface (e.g., 415b) of the second layer 415, or to a surface of the third layer 419a (e.g., as perpendicular or normal motion). In an embodiment, when both the first set of electromagnets 416a-416d and the second set of electromagnets 426a-426d are activated, the haptic actuator 410 may behave as a voice coil, in which the permanent magnet 417 and the electromagnets 416a-416d, 426a-426d may exert a Lorentz force on each other. In such an embodiment, the permanent magnet 417 of the third layer 419a may be actuated to move along an axis that is parallel to a surface of the first actuation component 411, a surface of the second layer 415, or a surface of the third layer 419a (e.g., as lateral motion). Thus, in an embodiment, a control unit of the haptic actuator 410 may be configured to determine, based on a desired direction of actuation of the third layer 419a, whether to actuate only the first set of electromagnets 416a-416d, actuate only the second set of electromagnets 426a-426d, or actuate both the first set of electromagnets 416a-416d and the second set of electromagnets 426a-426d. For instance, in response to a determination to actuate the third layer 418 in a direction perpendicular to the first layer 411, the control unit may activate only the first set of electromagnets 416a-416d or activate only the second set of electromagnets 426a-426d. In response to a determination to actuate the third layer 418 in a direction parallel to the first layer 411, the control unit may activate both the first set of electromagnets 416a-416d and the second set of electromagnets 426a-426d.

While FIG. 9 illustrates the magnetized material of the permanent magnet 417 being disposed on a middle (third) layer 419a, and the electromagnets 416a-416d, 426a-426d being disposed on the first actuation component 411 and the second layer 415, in another embodiment this arrangement may be reversed. In such an embodiment, one or more electromagnets (e.g., electromagnets 416a-416d) may be disposed on the third layer 419a, while magnetized material of a permanent magnet is disposed on the first actuation component 411 and on the second layer 415.

Figure 10:
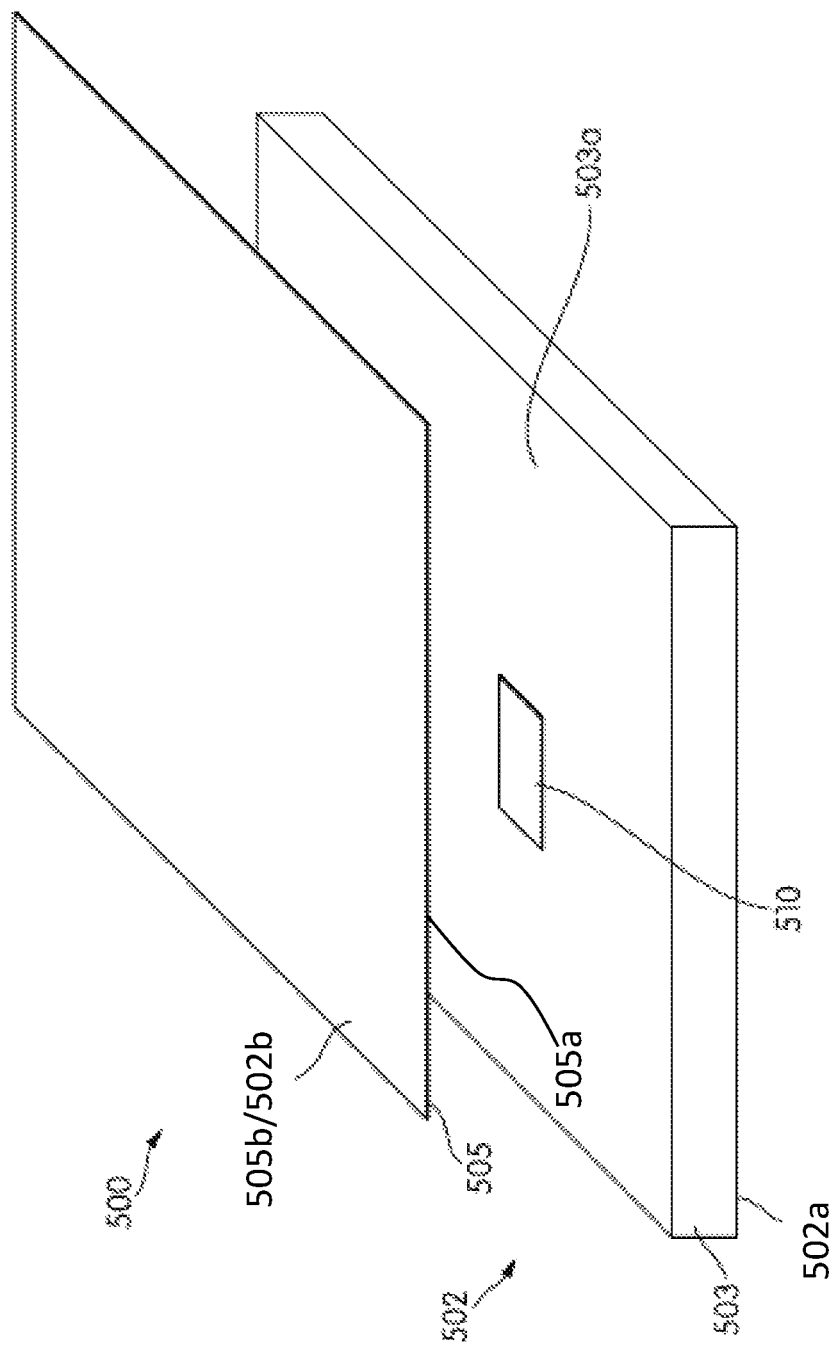
FIG. 10 illustrates a perspective view of a haptic-enabled device, according to an embodiment hereof.

FIG. 10 illustrates a haptic-enabled device 500 in which a haptic actuator 510, which may be the same or similar to any one of the haptic actuators described with reference to FIGS. 2A through 9, is disposed adjacent to an inward-facing surface 505a of a display device 505. In an embodiment, the display device 505 is a flexible OLED device. The display device 505 may be viewable through an outward-facing surface 505b of the display device 505. In an embodiment, the haptic-enabled device may be a phone or tablet computer, and may have a housing 502 that includes a casing 503 that forms a rear outer surface 502a of the housing 502. In an embodiment, the outward-facing surface 505b of the display device 505 may also form at least part of a front outer surface 502b of the housing 502 of the haptic-enabled device 500. In an embodiment, the haptic actuator 510 may be similar to the haptic actuator 210, 210b, 210c, 310, or 410. The haptic actuator 510 may include a first actuation component that is a smart material actuation component configured to deform the flexible display device 504, and a second actuation component that is an electromagnet actuation component configured to vibrate the housing 502.

In an embodiment, if the haptic-enabled device 500 is a mobile phone or a smart watch that is able to receive a text message or a call, a control unit of the haptic-enabled device may control whether a first actuation component (e.g., smart material actuation component) or a second actuation component (e.g., electromagnet actuation component) of the haptic actuator 510 is activated based on an urgency or importance of the text or the call. For instance, the control unit may be configured to determine that the haptic-enabled device is receiving or has received communication from another mobile phone, and to determine whether a priority level of communication exceeds a defined threshold. In response to a determination that the priority level of the communication exceeds the defined threshold, the control unit may be configured to provide a first electrical signal to at least the second actuation component (e.g., the electromagnet actuation component), and may cause the first electrical signal to have a frequency that is in a range of 100 Hz to 200 Hz. In response to a determination that the priority level of the communication does not exceed the defined threshold, the control unit may provide a second electrical signal to at least the first actuation component (e.g., the smart material actuation component), and cause the second electrical signal to have a frequency that is in a range of 1 Hz to 10 Hz. Thus, a call or text message having a low or medium importance level (e.g., a regular call) may cause the haptic actuator to generate a haptic effect with low-frequency content with at least the first actuation component, while a call having a high importance level (e.g., an urgent call) may cause the haptic actuator to generate a haptic effect with high frequency content with the second actuation component. Further, the haptic effect that is generated for the call of a low or medium level of importance may have a lower intensity (e.g., lower amount of movement) than the haptic effect that is generated for the call of a high level of importance.

As another example, a haptic actuator may generate a haptic effect that provides a series of taps corresponding to how many times a haptic-enabled device (e.g., a mobile phone) has missed a call from a particular caller. For instance, if a particular user has a friend who calls the user's mobile phone three times and the calls are all missed, a control unit of the mobile phone may cause a haptic actuator (e.g., haptic actuator 210) to output three taps with a smart material actuation component of the haptic actuator.

In another example, when a user is pushing on an outer surface 502b of a housing of a haptic-enabled device 500, such as part of a button press, the haptic-enabled device 500 may have a haptic actuator 510 with a smart material actuation component for creating a deformation in the outer surface 502b that pushes back on the user. Further, an electromagnet actuation component of the haptic actuator may be activated to output vibration as a confirmation of the press. In some implementations, the frequency at which the smart material actuation component is activated may change (e.g., increase) during the outputting of the haptic effect in order to notify a user of additional information.

In an embodiment, the embodiments of the haptic actuator described above may be embedded in a mobile phone, a tablet computer, a game controller, a virtual reality (VR) or augmented reality (AR) controller, or a wearable device, such as a headset.

While various embodiments have been described above, it should be understood that they have been presented only as illustrations and examples of the present invention, and not by way of limitation. It will be apparent to persons skilled in the relevant art that various changes in form and detail can be made therein without departing from the spirit and scope of the invention. Thus, the breadth and scope of the present invention should not be limited by any of the above-described exemplary embodiments, but should be defined only in accordance with the appended claims and their equivalents. It will also be understood that each feature of each embodiment discussed herein, and of each reference cited herein, can be used in combination with the features of any other embodiment.

What is claimed is:

1. A haptic actuator comprising:
   a first actuation component that comprises a first layer of actuatable material and comprises electrodes on opposite sides of the first layer, wherein the actuatable material is configured to deform upon any electrical signal being applied to at least one of the electrodes;
   a second layer separated from the first actuation component by one or more spacers;
   a second actuation component comprising a magnetized material and one or more electromagnets,
   wherein either the magnetized material or the one or more electromagnets are disposed on the first actuation component, and
   wherein relative movement between the magnetized material and the one or more electromagnets is generated upon any electrical signal being applied to the one or more electromagnets, wherein the relative movement between the magnetized material and the one or more electromagnets causes vibration of the first actuation component.

2. The haptic actuator of claim 1, wherein the magnetized material of the second actuation component is disposed on either one of: a first surface of the first actuation component or a second surface of the second layer, and the one or more electromagnets are disposed on the other one of the first surface of the first actuation component or the second surface of the second layer.

3. The haptic actuator of claim 2, wherein the first surface of the first actuation component faces the second surface of the second layer, and wherein the magnetized material is disposed on the first surface of the first actuation component, and the one or more electromagnets are disposed on the second surface of the second layer.

4. The haptic actuator of claim 1, further comprising a haptic control unit configured to apply a first electrical signal to one of the electrodes on opposite sides of the first layer of actuatable material of the first actuation component, and configured to apply a second electrical signal to the one or more electromagnets of the second actuation component, wherein the second electrical signal is a periodic signal having a second frequency, and the first electrical signal is a periodic signal having a first frequency lower than the second frequency, or is a direct current (DC) signal.

5. The haptic actuator of claim 4, wherein the first frequency is in a range of 1 Hz to 500 Hz, and the second frequency is in a range of 1 Hz to 500 Hz, and wherein the first amplitude is in a range of 1 V to 2000 V, and the second amplitude is in a range of 1 V to 12 V.

6. The haptic actuator of claim 1, wherein the one or more electromagnets of the second actuation component comprises one or more respective conductive coils, and wherein the magnetized material of the second actuation component comprises a polymer film having magnetized particles embedded therein.

7. The haptic actuator of claim 1, wherein the first layer of actuatable material of the first actuation component is a layer of electroactive polymer (EAP) material.

8. The haptic actuator of claim 1, wherein the first layer of actuatable material of the first actuation component includes at least one of an elastomer material, a shape memory alloy, or a ceramic composite material.

9. The haptic actuator of claim 1, further comprising a first signal generator electrically connected to at least one of the electrodes disposed on opposite sides of the first layer of actuatable material, and a second signal generator electrically connected to the one or more electromagnets of the second actuation component,
   wherein the haptic actuator has a thickness that is in a range of 0.001 mm to 10 mm,
   wherein the one or more spacers have a thickness that is in a range of 0.1 mm to 10 mm, and are configured to form a suspension between the first actuation component and the second layer, and
   wherein the suspension has a resonance frequency that is in a range of 1 Hz and 500 Hz.

10. The haptic actuator of claim 1, further comprising a third layer disposed between the first layer and the second layer and attached to the one or more spacers via an elastic material, wherein the one or more electromagnets of the second actuation component include a first electromagnet or first set of electromagnets disposed on a surface of the first actuation component, and a second electromagnet or second set of electromagnets disposed on a surface of the second layer, and wherein the magnetized material of the second actuation component is disposed on the third layer.

11. The haptic actuator of claim 10, further comprising a haptic control unit configured to determine, based on a desired direction of actuation, whether to actuate only the first electromagnet or first set of electromagnets, actuate only the second electromagnet or second set of electromagnets, or actuate both the first electromagnet or first set of electromagnets and the second electromagnet or second set of electromagnets.

12. The haptic actuator of claim 11, wherein the haptic control unit is configured:
   in response to a determination to actuate the third layer in a direction perpendicular to the surface of the first actuation component, to activate only the first electromagnet or first set of electromagnets or activate only the second electromagnet or second set of electromagnets, and
   in response to a determination to actuate the third layer in the direction parallel to the surface of the first actuation component, to activate both the first electromagnet or first set of electromagnets and the second electromagnet or second set of electromagnets.

13. The haptic actuator of claim 1, further comprising a third layer disposed between the first layer and the second layer and attached to the one or more spacers via an elastic material, wherein the one or more electromagnets of the second actuation component are disposed on the third layer, and wherein the magnetized material is disposed on a first surface of the first layer and on a second surface of the second layer.

14. A haptic-enabled user interface device, comprising:
   a housing having a first outer surface and a second and opposite outer surface;
   a haptic actuator disposed within or outside the housing, and adjacent to the first outer surface or the second outer surface, the haptic actuator further comprising:
      a first actuation component having a first layer of an actuatable material and comprises electrodes on opposite sides of the first layer, wherein the actuatable material is configured to deform upon any electrical signal being applied to at least one of the electrodes,
      a second layer separated from the first actuation component by one or more spacers, and disposed closer than the first layer to an interior of the housing, and
      a second actuation component comprising a magnetized material and one or more electromagnets,
   wherein either the magnetized material or the one or more electromagnets are disposed on the first actuation component,
   wherein relative movement between the magnetized material and the one or more electromagnets is generated upon any electrical signal being applied to the one or more electromagnets, and
   wherein the haptic actuator is configured to generate a haptic effect at the first outer surface or the second outer surface of the housing of the haptic-enabled device by activating at least one of the first actuation component or the second actuation component.

15. The haptic-enabled device of claim 14, further comprising a flexible display device having an outer surface, wherein the outer surface of the flexible display device forms at least part of the first outer surface of the haptic-enabled device.

16. The haptic-enabled device of claim 15, wherein:
   the haptic-enabled device is a wearable electronic device,
   the one or more spacers of the haptic actuator is a first spacer or first set of spacers,
   the haptic actuator is adjacent to the second outer surface of the housing, and is configured to deform the second outer surface when the first actuation component of the haptic actuator is activated,
   the housing of the haptic-enabled device includes a second spacer or second set of spacers that extend outwardly past the haptic actuator and the second outer surface of the housing, so as to provide clearance between second outer surface and any object in contact with the second spacer or second set of spacers, and
   the second spacer or second set of spacers form a rim that extends outwardly past the second outer surface of the housing.

17. The haptic-enabled device of claim 16, wherein the haptic actuator is disposed within the housing, the second outer surface being formed from a layer of flexible material, and wherein deformation of the first actuation component of the haptic actuator causes deformation of the layer of flexible material of the second outer surface of the housing.

18. The haptic-enabled device of claim 16, wherein the haptic actuator is disposed outside of the housing, and the second layer of the haptic actuator is adhered to the second outer surface of the housing.

19. The haptic-enabled device of claim 16, wherein the haptic-enabled device is an electronic watch.

20. The haptic-enabled device of claim 15, wherein the haptic actuator is adjacent to the first outer surface of the housing, and is configured to deform the first outer surface of the housing when the first actuation component of the haptic actuator is activated.

21. The haptic-enabled device of claim 14, wherein the haptic-enabled device is a mobile phone, and wherein the haptic-enabled device further comprises a haptic control unit configured:

to determine that the haptic-enabled device is receiving or has received communication from another mobile phone;

to determine whether a priority level of communication exceeds a defined threshold;

in response to a determination that the priority level of the communication exceeds the defined threshold, provide a first electrical signal to at least the one or more electromagnets, the first electrical signal having a frequency that is in a range of 1 Hz to 500 Hz, and in response to a determination that the priority level of the communication does not exceed the defined threshold, provide a second electrical signal to at least one of the electrodes on opposite sides of the first layer of actuatable material, the second electrical signal having a frequency that is in a range of 1 Hz to 500 Hz.

22. The haptic-enabled device of claim 14, wherein the haptic-enabled device is configured to output a tap or a series of taps with the first layer of actuatable material of the first actuation component of the haptic actuator.

* * * * *